(12) United States Patent
Wang et al.

(10) Patent No.: US 11,742,404 B2
(45) Date of Patent: Aug. 29, 2023

(54) METHOD OF MANUFACTURING A SEMICONDUCTOR DEVICE AND A SEMICONDUCTOR DEVICE

(71) Applicant: TAIWAN SEMICONDUCTOR MANUFACTURING CO., LTD., Hsinchu (TW)

(72) Inventors: Chun Chieh Wang, Kaohsiung (TW); Yueh-Ching Pai, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 72 days.

(21) Appl. No.: 17/169,892

(22) Filed: Feb. 8, 2021

(65) Prior Publication Data

US 2021/0343851 A1    Nov. 4, 2021

Related U.S. Application Data

(60) Provisional application No. 63/017,497, filed on Apr. 29, 2020.

(51) Int. Cl.

| | | |
|---|---|---|
| *H01L 29/423* | (2006.01) | |
| *H01L 29/417* | (2006.01) | |
| *H01L 29/49* | (2006.01) | |
| *H01L 21/28* | (2006.01) | |
| *H01L 29/08* | (2006.01) | |
| *H01L 29/66* | (2006.01) | |
| *H01L 29/78* | (2006.01) | |
| *H01L 21/285* | (2006.01) | |
| *H01L 21/8234* | (2006.01) | |

(52) U.S. Cl.
CPC .. *H01L 29/42376* (2013.01); *H01L 21/28088* (2013.01); *H01L 21/28114* (2013.01); *H01L 21/28518* (2013.01); *H01L 21/823437* (2013.01); *H01L 29/0847* (2013.01); *H01L 29/41791* (2013.01); *H01L 29/4966* (2013.01); *H01L 29/66545* (2013.01); *H01L 29/66795* (2013.01); *H01L 29/7851* (2013.01)

(58) Field of Classification Search
CPC .................. H01L 21/823437; H01L 29/66545
See application file for complete search history.

(56) References Cited

U.S. PATENT DOCUMENTS 9,865,697 B1 * 1/2018 Hsueh ................. H01L 29/7848
2016/0365449 A1 * 12/2016 Chang ................. H01L 29/7851
(Continued)

FOREIGN PATENT DOCUMENTS

| TW | 201643997 A | 12/2016 |
| TW | 201839815 A | 11/2018 |
| TW | 201905985 A | 2/2019 |

*Primary Examiner* — Farun Lu
(74) *Attorney, Agent, or Firm* — McDermott Will & Emery LLP

(57) ABSTRACT

In a method of manufacturing a semiconductor device, a gate space is formed by removing a sacrificial gate electrode, a gate dielectric layer is formed in the gate space, conductive layers are formed on the gate dielectric layer to fully fill the gate space, the gate dielectric layer and the conducive layers are recessed to form a recessed gate electrode, and a contact metal layer is formed on the recessed gate electrode. The recessed gate electrode does not includes tungsten, and the contact metal layer includes tungsten.

20 Claims, 20 Drawing Sheets

(56) References Cited

U.S. PATENT DOCUMENTS

| | | | |
|---|---|---|---|
| 2017/0352559 A1* | 12/2017 | Liu | H01L 21/0274 |
| 2018/0166560 A1* | 6/2018 | Chiang | H01L 21/82345 |
| 2018/0174922 A1* | 6/2018 | Chiu | H01L 29/785 |
| 2018/0308751 A1* | 10/2018 | Wang | H01L 29/41775 |
| 2019/0385912 A1 | 12/2019 | Jacobi et al. | |

* cited by examiner

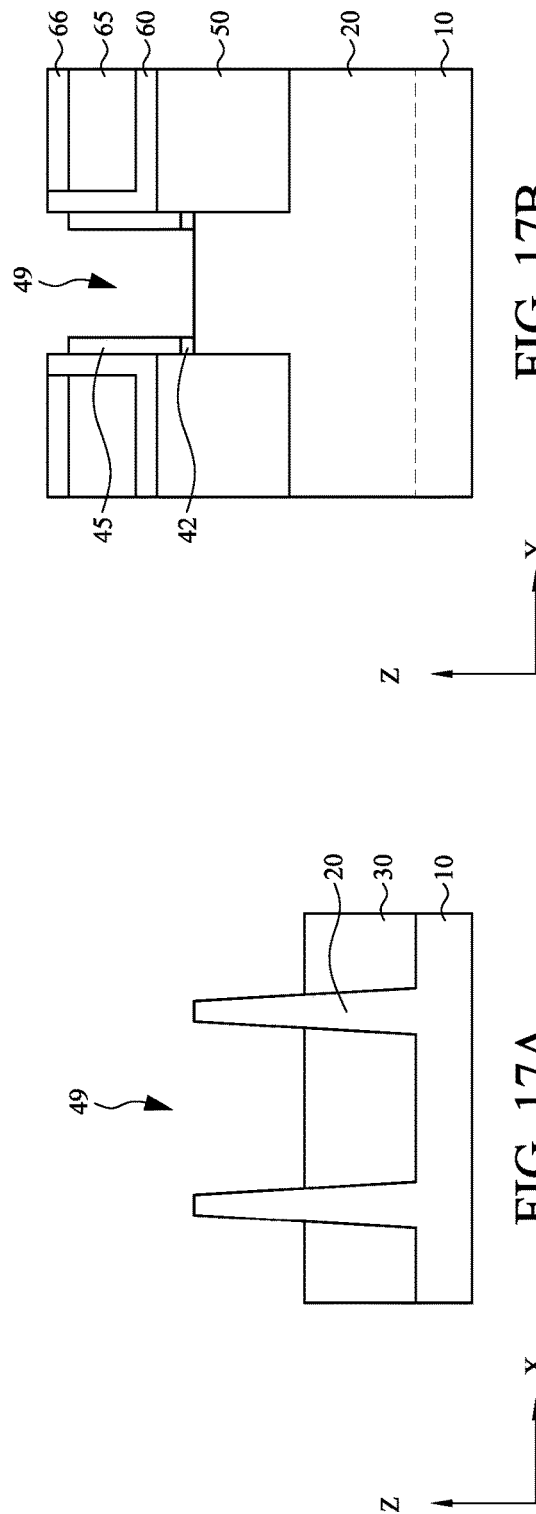
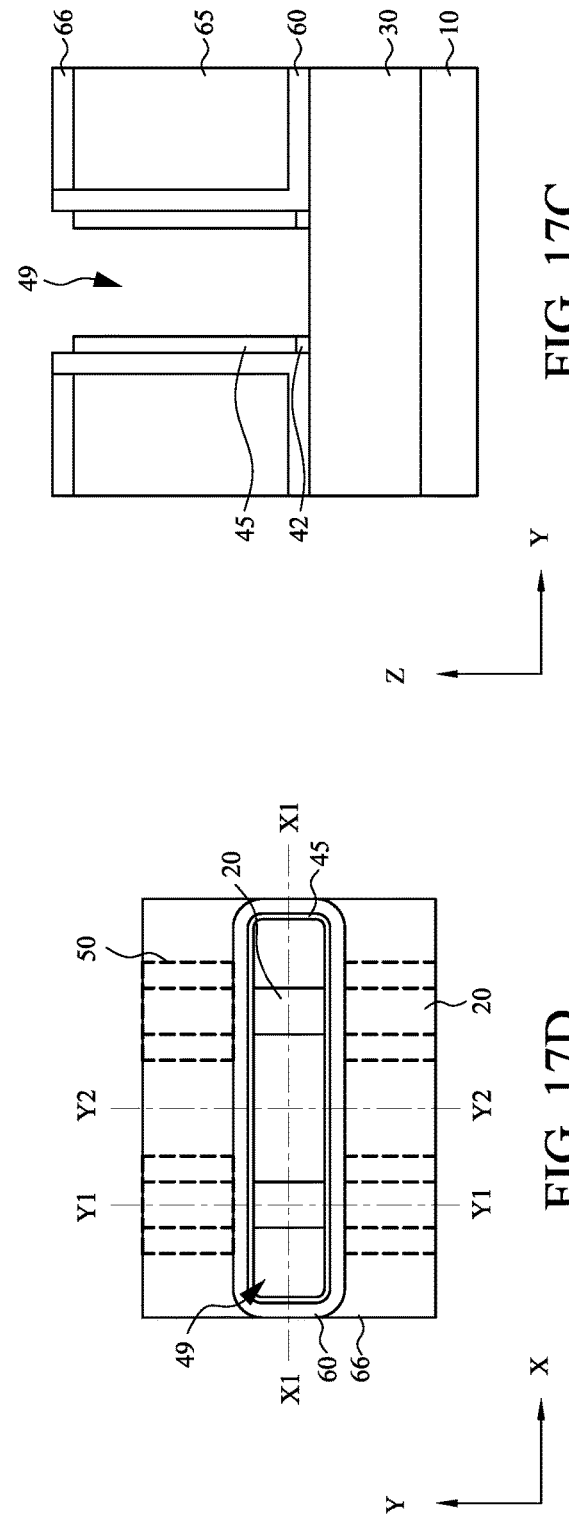
FIG. 17A
FIG. 17B
FIG. 17C
FIG. 17D

METHOD OF MANUFACTURING A SEMICONDUCTOR DEVICE AND A SEMICONDUCTOR DEVICE

RELATED APPLICATIONS

This application claims priority to U.S. Provisional Patent Application No. 63/017,497 filed on Apr. 29, 2020, the entire content of which is incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (FinFET) and a gate-all-around (GAA) FET. In a FinFET, a gate electrode is adjacent to three side surfaces of a channel region with a gate dielectric layer interposed therebetween. A gate electrode of a FinFET includes one or more layers of metallic material formed by a gate replacement technology.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 17A, 17B, 17C and 17D show various stages of a sequential process for manufacturing a semiconductor device according to an embodiment of the present disclosure.

DETAILED DESCRIPTION

Figure 2:
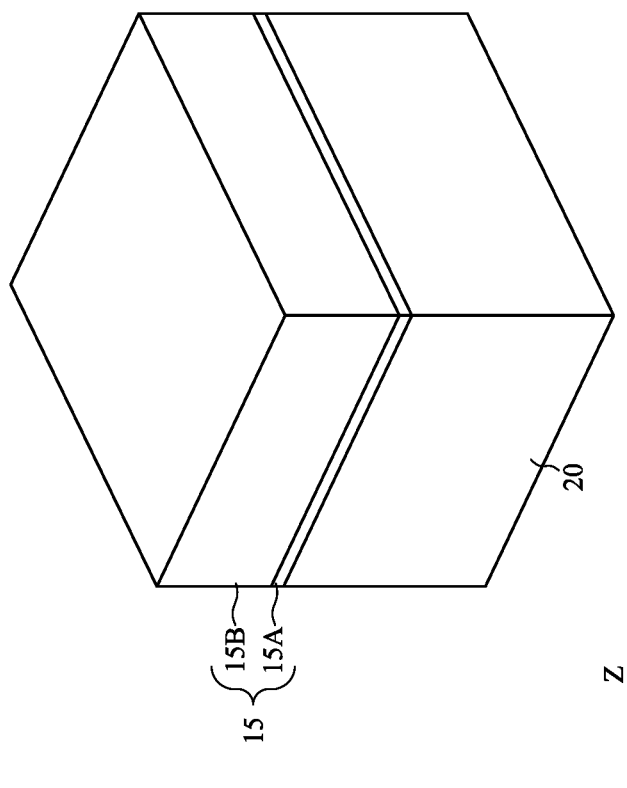
FIG. 2 shows one of the stages of a sequential process for manufacturing a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

In a gate replacement technology, a sacrificial gate structure including a sacrificial gate electrode (made of, for example, polysilicon) is first formed over a channel region and subsequently is replaced with a metal gate structure. In metal gate FinFETs, device performance is affected by a metal gate profile (shape) design, and the metal gate profile is often dependent on the profile of a sacrificial gate electrode. In some FinFET devices, after the gate replacement process to form a metal gate structure, an upper portion of the metal gate structure is recessed and a cap insulating layer is formed over the recessed gate structure to secure an isolation region between the metal gate electrode and adjacent conductive contacts. Further, in advanced FinFET devices, various FETs (n-channel and p-channel FETs) with different threshold voltages are fabricated in one device and FETs may have different metal (e.g., work function adjustment metals) structures. Gate recess etching to form a gate cap may be affected by the metal structures and it is desirable to recess the metal gate structure to a desired level regardless of the metal structures. In the present disclosure, a method of controlling heights of the recessed metal gate structure by adjusting a profile (shape) of the sacrificial gate electrode is provided.

FIGS. 1-16 show a sequential process for manufacturing an FET device according to an embodiment of the present disclosure. It is understood that additional operations can be provided before, during, and after processes shown by FIGS. 1-16, and some of the operations described below can be replaced or eliminated, for additional embodiments of the method. The order of the operations/processes may be interchangeable.

Figure 1:
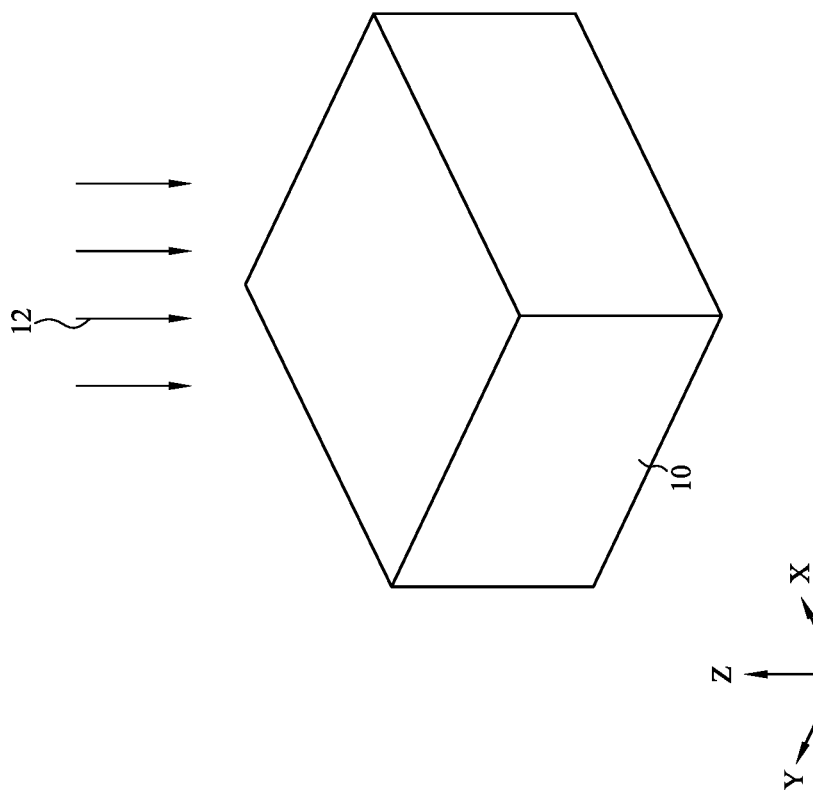
FIG. 1 shows one of the stages of a sequential process for manufacturing a semiconductor device according to an embodiment of the present disclosure.

As shown in FIG. 1, impurity ions (dopants) 12 are implanted into a silicon substrate 10 to form a well region. The ion implantation is performed to prevent a punch-through effect.

In one embodiment, substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

The substrate 10 may include various regions that have been suitably doped with impurities (e.g., p-type or n-type conductivity). The dopants 12 are, for example boron ($BF_2$) for an n-type Fin FET and phosphorus for a p-type Fin FET.

In FIG. 2, a mask layer 15 is formed over the substrate 10. In some embodiments, the mask layer 15 includes a first mask layer 15A and a second mask layer 15B. In some embodiments, the first mask layer 15A is made of silicon nitride and the second mask layer 15B is made of a silicon oxide. In other embodiments, the first mask layer 15A is made of silicon oxide and the second mask layer 15B is made of silicon nitride (SiN). The first and second mask layers are formed by chemical vapor deposition (CVD), including low pressure CVD (LPCVD) and plasma enhanced CVD (PECVD), physical vapor deposition (PVD), atomic layer deposition (ALD), or other suitable process. The mask layer 15 is patterned into a mask pattern by using patterning operations including photo-lithography and etching.

Figure 3:
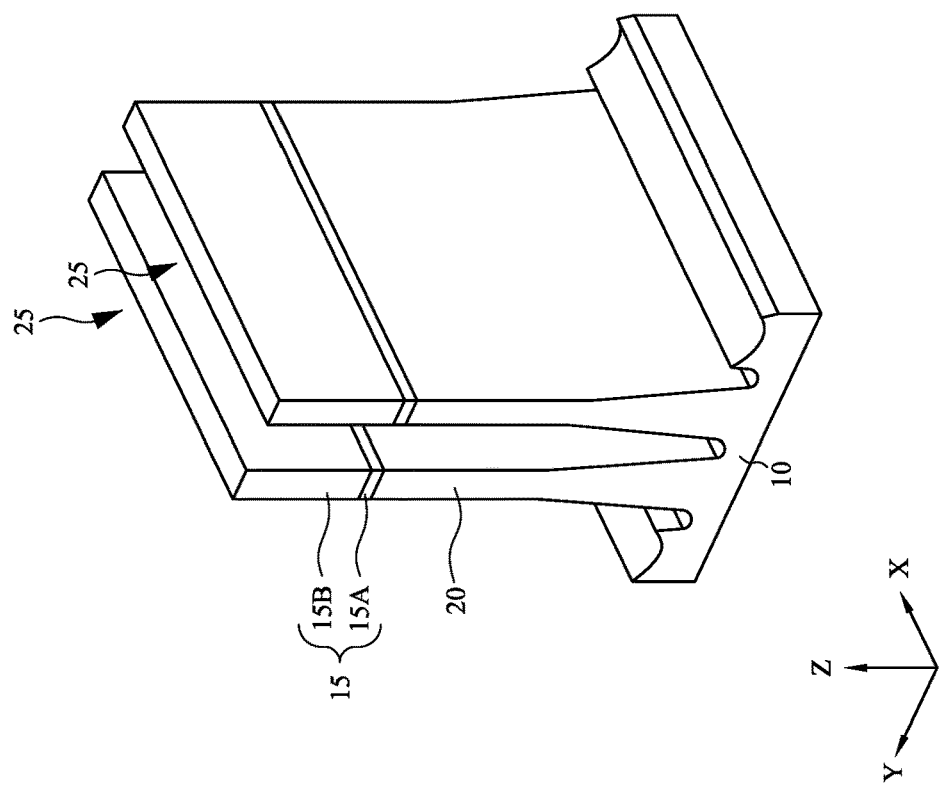
FIG. 3 shows one of the stages of a sequential process for manufacturing a semiconductor device according to an embodiment of the present disclosure.

Next, as shown in FIG. 3, the substrate 10 is patterned by using the patterned mask layer 15 into fin structures 25 extending in the X direction. In FIG. 3, two fin structures 25 are arranged in the Y direction. But the number of the fin structures is not limited to two, and may be as small as one and three or more. In some embodiments, one or more dummy fin structures are formed on both sides of the fin structures 25 to improve pattern fidelity in the patterning operations.

The fin structures 25 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

After the fin structure is formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surface of the uppermost second fin structure 25 is exposed from the insulating material layer 30 as shown in FIG. 4.

Figure 4:
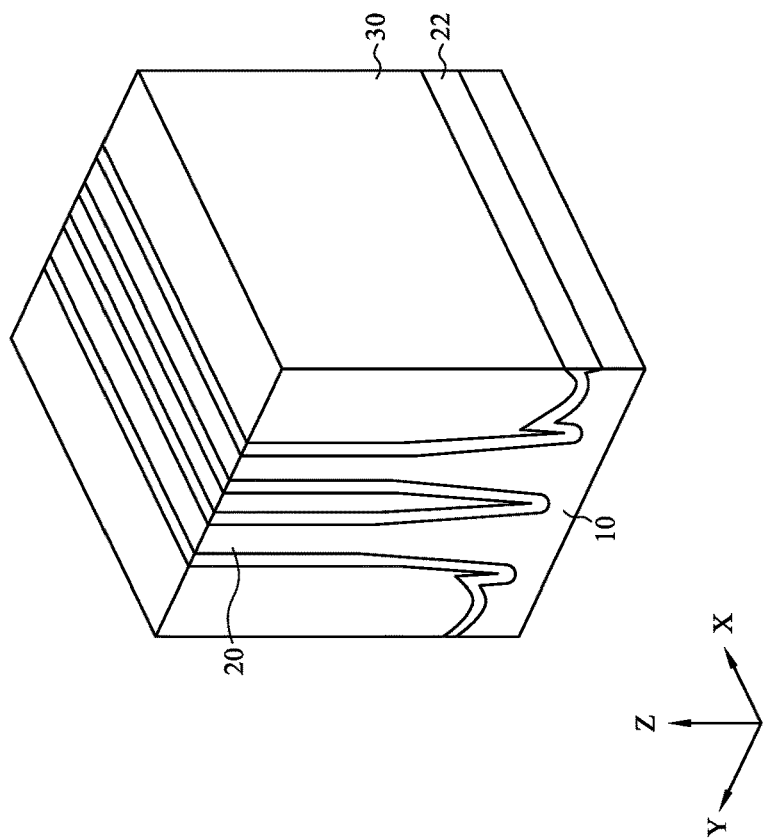
FIG. 4 shows one of the stages of a sequential process for manufacturing a semiconductor device according to an embodiment of the present disclosure.

In some embodiments, one or more liner layers 22 are formed over the structure of FIG. 3 before forming the insulating material layer 30, as shown FIG. 4. The liner layer 22 includes one or more of silicon nitride, SiON, SiCN, SiOCN, and silicon oxide.

Figure 5:
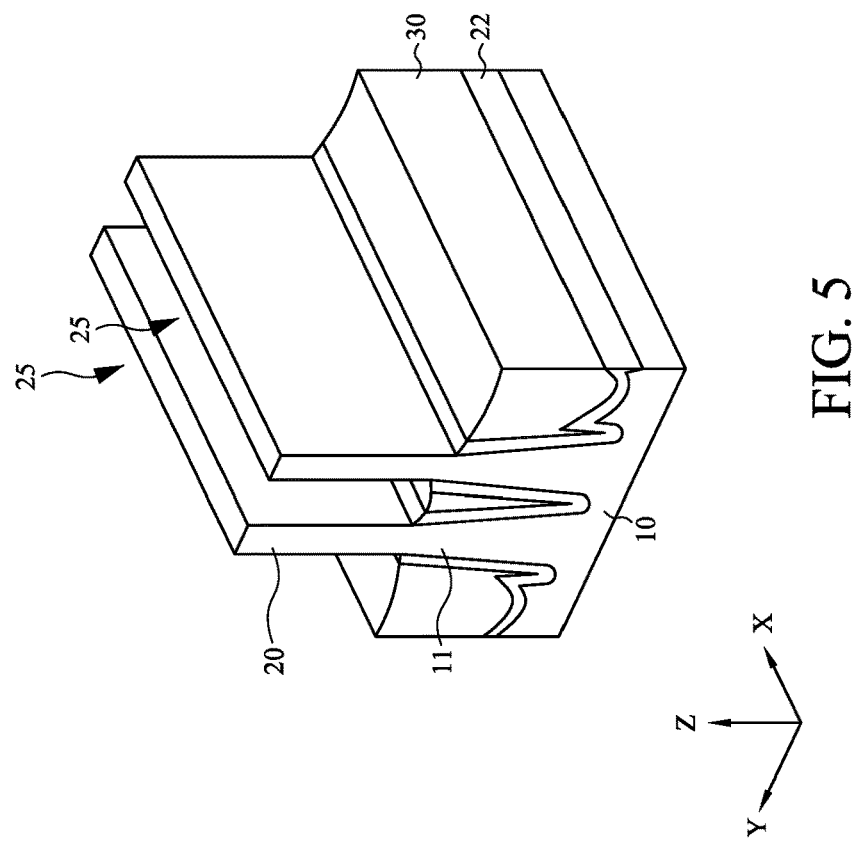
FIG. 5 shows one of the stages of a sequential process for manufacturing a semiconductor device according to an embodiment of the present disclosure.

Then, as shown in FIG. 5, the insulating material layer 30 is recessed to form an isolation insulating layer 30 so that the upper portions of the fin structures 20 are exposed. With this operation, the fin structures 25 are electrically separated from each other by the isolation insulating layer 30, which is also called a shallow trench isolation (STI). The lower portion 11 of the fin structure is embedded in the isolation insulating layer 30.

Figure 6:
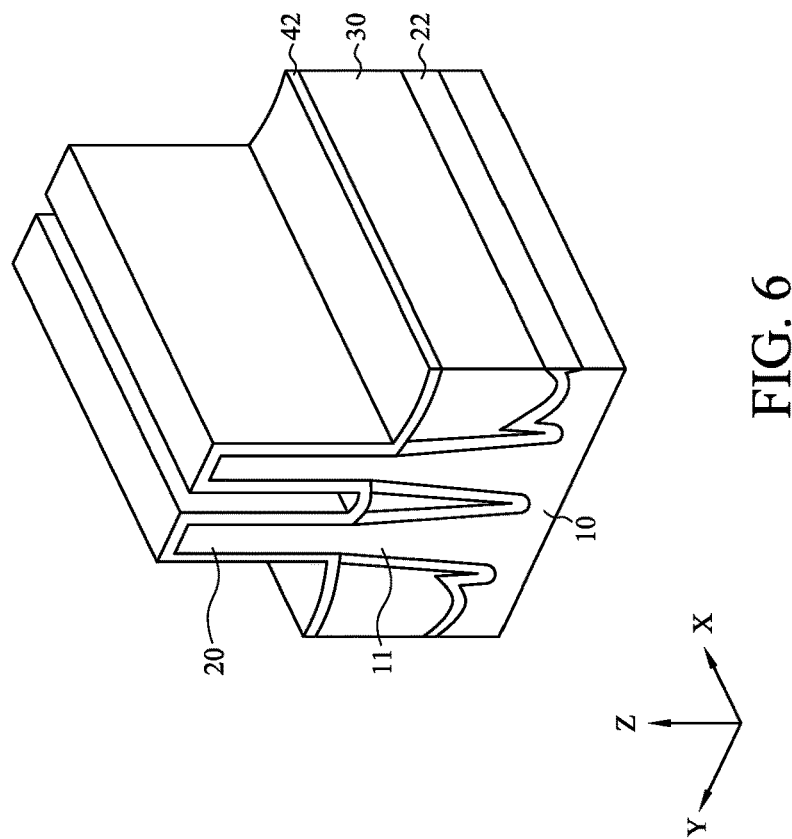
FIG. 6 shows one of the stages of a sequential process for manufacturing a semiconductor device according to an embodiment of the present disclosure.

After the isolation insulating layer 30 is formed, a sacrificial gate dielectric layer 42 is formed, as shown in FIG. 6. The sacrificial gate dielectric layer 42 includes one or more layers of insulating material, such as a silicon oxide-based material. In one embodiment, silicon oxide formed by CVD is used. The thickness of the sacrificial gate dielectric layer 42 is in a range from about 1 nm to about 5 nm in some embodiments.

Figure 7:
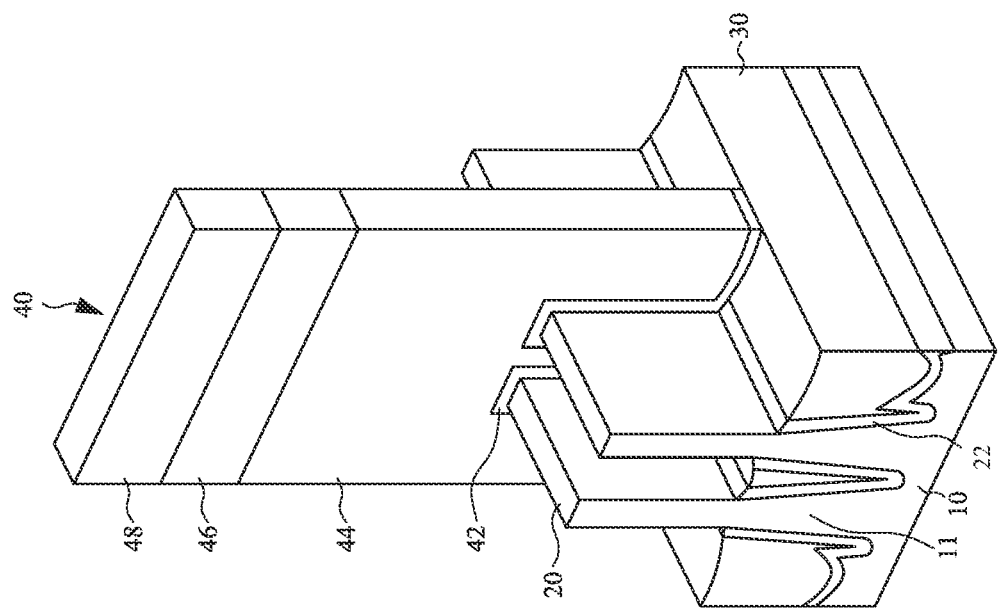
FIG. 7 shows one of the stages of a sequential process for manufacturing a semiconductor device according to an embodiment of the present disclosure.

FIG. 7 illustrates a structure after a sacrificial gate structure 40 is formed over the exposed fin structures 25. The sacrificial gate structure includes a sacrificial gate electrode 44 and the sacrificial gate dielectric layer 42. The sacrificial gate structure 40 is formed over a portion of the fin structure which is to be a channel region. The sacrificial gate structure 40 is formed by first blanket depositing the sacrificial gate dielectric layer 42 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad SiN layer 46 and a silicon oxide mask layer 48.

Next, a patterning operation is performed on the mask layer and sacrificial gate electrode layer is patterned into the sacrificial gate structure 40, as shown in FIG. 7. The patterning operations of sacrificial gate structure 40 will be explained below in more detail.

The sacrificial gate structure 40 includes the sacrificial gate dielectric layer 42, the sacrificial gate electrode layer 44 (e.g., poly silicon), the pad SiN layer 46 and the silicon oxide mask layer 48 in some embodiments. By patterning the sacrificial gate structure 40, the upper portions of the fin structures 20 are partially exposed on opposite sides of the sacrificial gate structure 40, thereby defining source/drain (S/D) regions, as shown in FIG. 7. In this disclosure, a source and a drain are interchangeably used and the structures thereof are substantially the same. In FIG. 7, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Figure 8:
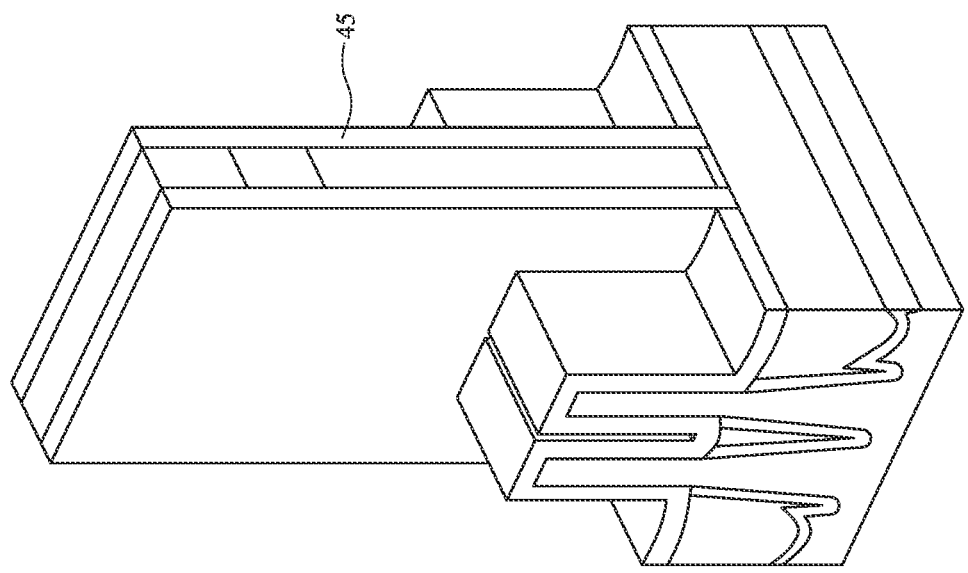
FIG. 8 shows one of the stages of a sequential process for manufacturing a semiconductor device according to an embodiment of the present disclosure.

After the sacrificial gate structure 40 is formed, a blanket layer 45 of an insulating material for sidewall spacers 45 is conformally formed by using CVD or other suitable methods, as shown in FIG. 8. The blanket layer 45 is deposited in a conformal manner so that it is formed to have substantially equal thicknesses on vertical surfaces, such as the sidewalls, horizontal surfaces, and the top of the sacrificial gate structure. In some embodiments, the blanket layer 45 is deposited to a thickness in a range from about 2 nm to about 10 nm. In one embodiment, the insulating material of the blanket layer 45 is a silicon nitride-based material, such as SiN, SiON, SiOCN or SiCN and combinations thereof.

Figure 9:
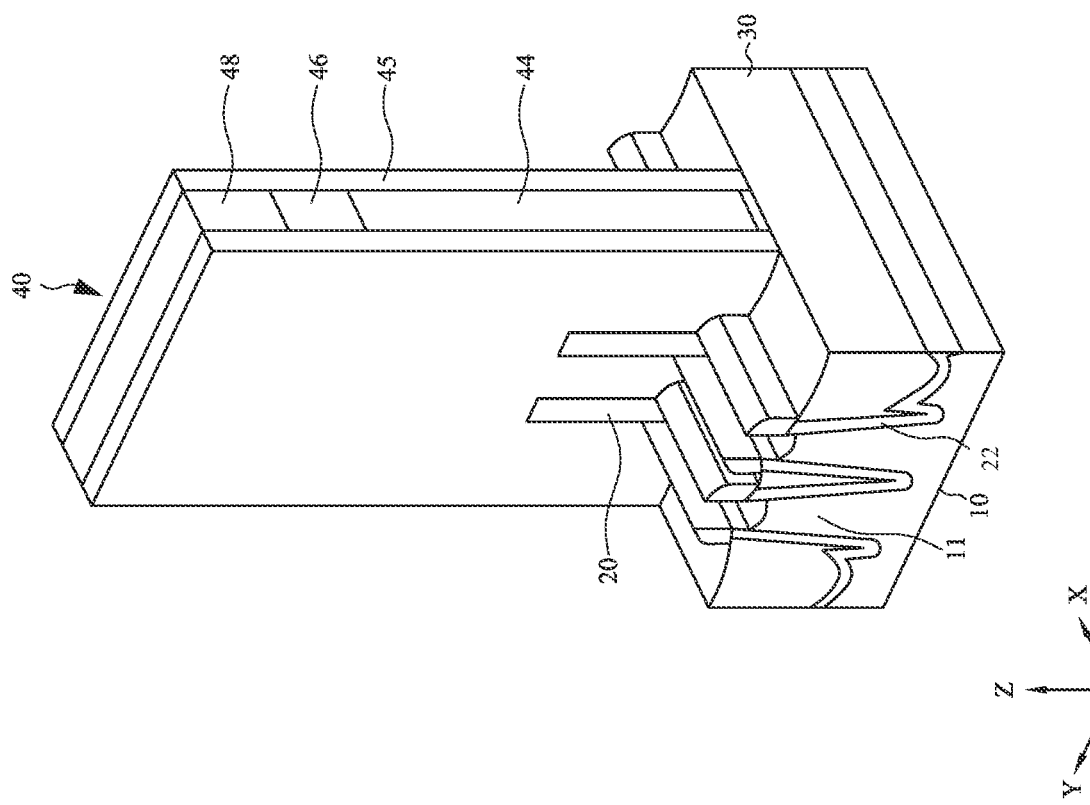
FIG. 9 shows one of the stages of a sequential process for manufacturing a semiconductor device according to an embodiment of the present disclosure.

Further, as shown in FIG. 9, sidewall spacers 45 are formed on opposite sidewalls of the sacrificial gate structures, and subsequently, the fin structures of the S/D regions are recessed down below the upper surface of the isolation insulating layer 30. After the blanket layer 45 is formed, anisotropic etching is performed on the blanket layer 45 using, for example, reactive ion etching (RIE). During the anisotropic etching process, most of the insulating material is removed from horizontal surfaces, leaving the dielectric spacer layer on the vertical surfaces such as the sidewalls of the sacrificial gate structures and the sidewalls of the exposed fin structures. The mask layer 48 may be exposed from the sidewall spacers. In some embodiments, isotropic etching may be subsequently performed to remove the insulating material from the upper portions of the S/D region of the exposed fin structures 25.

Subsequently, the fin structures of the S/D regions are recessed down below the upper surface of the isolation insulating layer 30, by using dry etching and/or wet etching. As shown in FIG. 9, the sidewall spacers 45 formed on the S/D regions of the exposed fin structures (fin sidewalls) partially remain. In other embodiments, however, the sidewall spacers 45 formed on the S/D regions of the exposed fin structures are fully removed. In case of a GAA FET, inner spacers are formed after the recessing the S/D regions.

Figure 10:
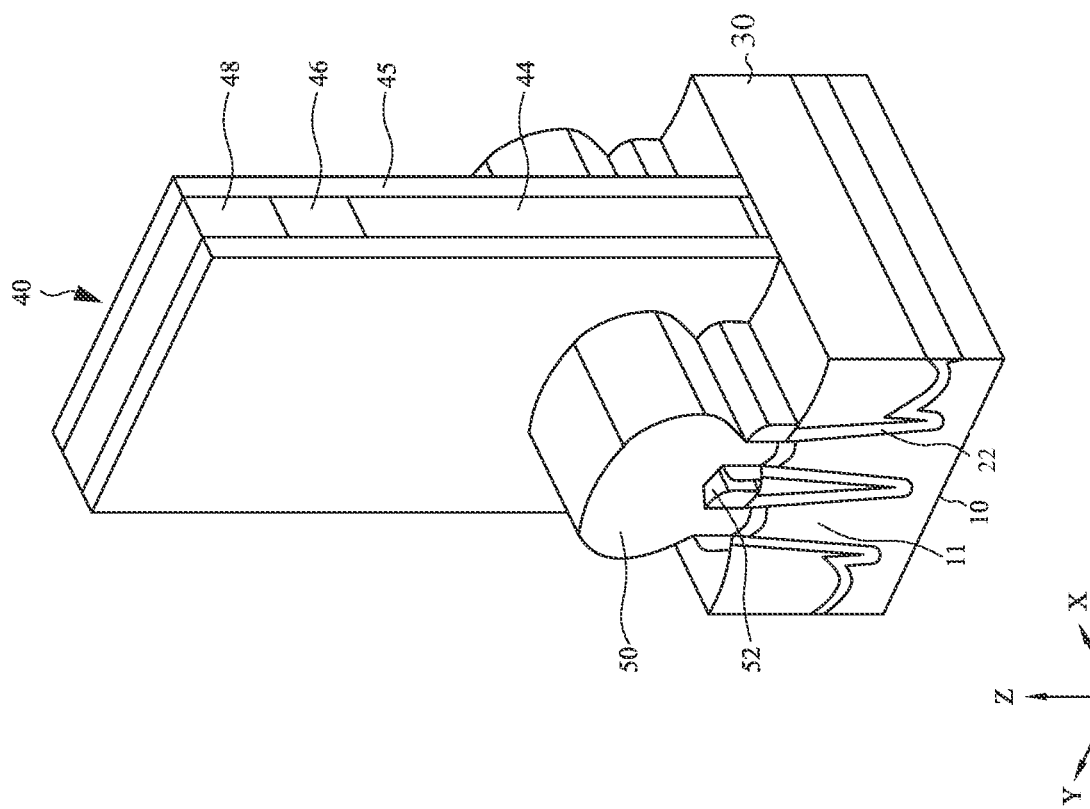
FIG. 10 shows one of the stages of a sequential process for manufacturing a semiconductor device according to an embodiment of the present disclosure.

Subsequently, as shown in FIG. 10, source/drain (S/D) epitaxial layers 50 are formed. The S/D epitaxial layer 50 includes one or more layers of Si, SiP, SiC and SiCP for an n-channel FET or Si, SiGe, Ge, GeSn and SiGeSn for a p-channel FET. The S/D layers 50 are formed by an epitaxial growth method using CVD, ALD or molecular beam epitaxy (MBE).

As shown in FIG. 10, the S/D epitaxial layers grow from the recessed fin structures respectively. The grown epitaxial layers merge above the isolation insulating layer and form a void 52 in some embodiments.

Figure 11:
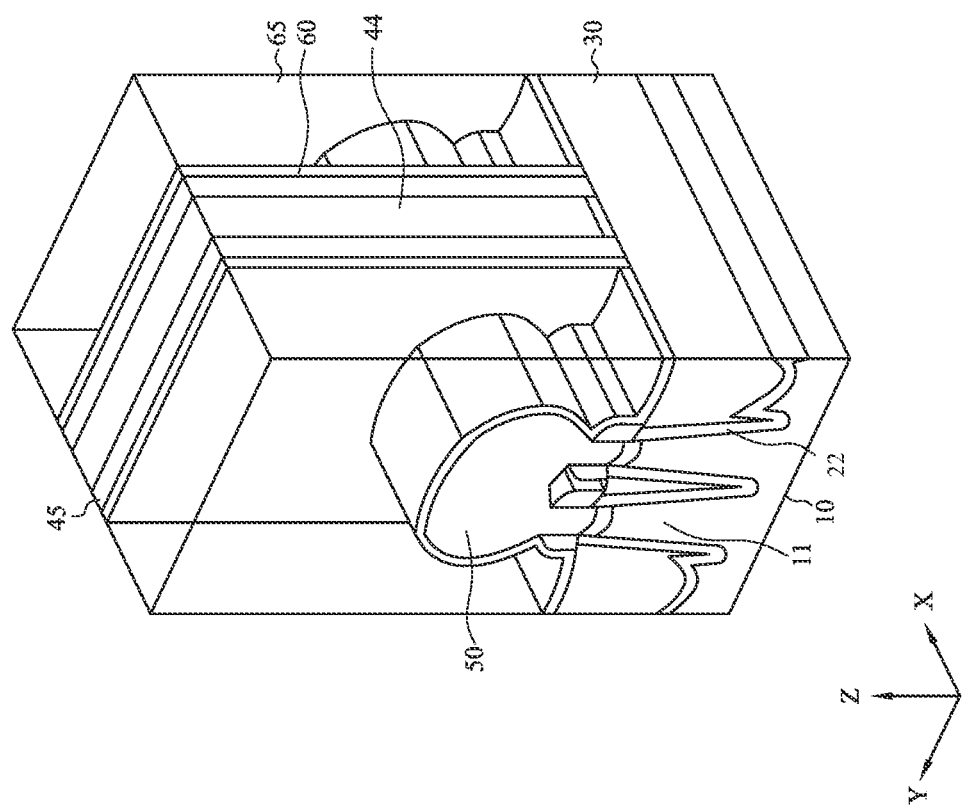
FIG. 11 shows one of the stages of a sequential process for manufacturing a semiconductor device according to an embodiment of the present disclosure.

Subsequently, an insulating liner layer 60, as an etch stop layer, is formed and then an interlayer dielectric (ILD) layer 65 is formed, as shown in FIG. 11. The insulating liner layer 60 is made of a silicon nitride-based material, such as SiN, and functions as a contact etch stop layer in the subsequent etching operations. The materials for the ILD layer 65 include compounds comprising Si, O, C and/or H, such as silicon oxide, SiCOH and SiOC. Organic materials, such as polymers, may be used for the ILD layer 65. After the ILD layer 65 is formed, a planarization operation, such as CMP, is performed, so that the top portion of the sacrificial gate electrode layer 44 is exposed, as shown in FIG. 11.

Figure 12:
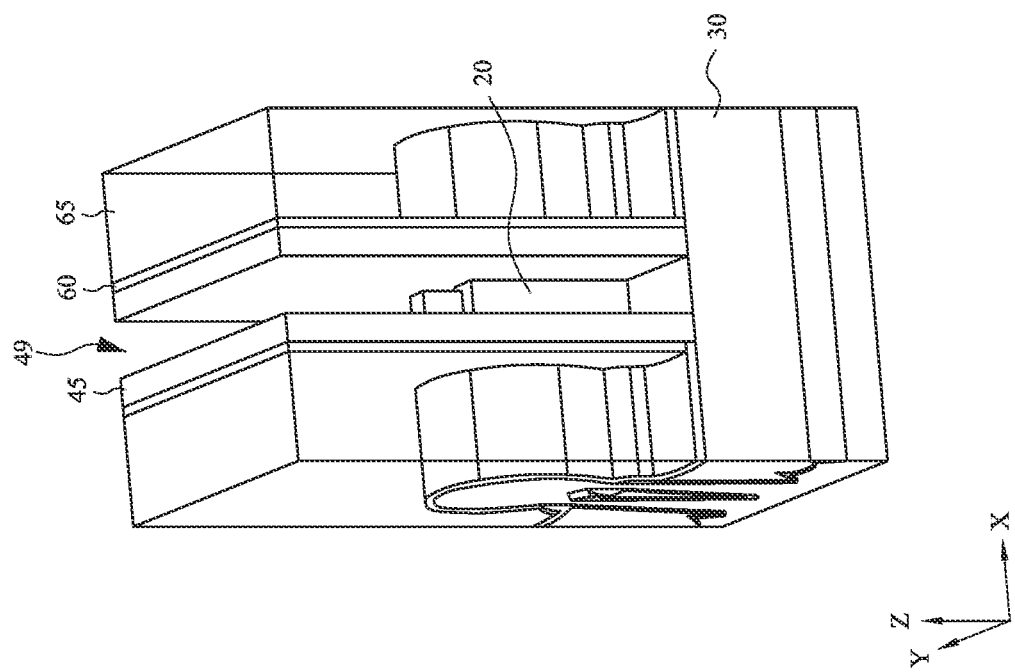
FIG. 12 shows one of the stages of a sequential process for manufacturing a semiconductor device according to an embodiment of the present disclosure.

Next, as shown in FIG. 12, the sacrificial gate electrode layer 44 and sacrificial gate dielectric layer 42 are removed, thereby exposing the fin structures in a gate space 49. The ILD layer 65 protects the S/D structures 50 during the removal of the sacrificial gate structures. The sacrificial gate structures can be removed using plasma dry etching and/or wet etching. When the sacrificial gate electrode layer 44 is polysilicon and the ILD layer 65 is silicon oxide, a wet etchant such as a TMAH solution can be used to selectively remove the sacrificial gate electrode layer 44. The sacrificial gate dielectric layer 42 is thereafter removed using plasma dry etching and/or wet etching.

Figure 13:
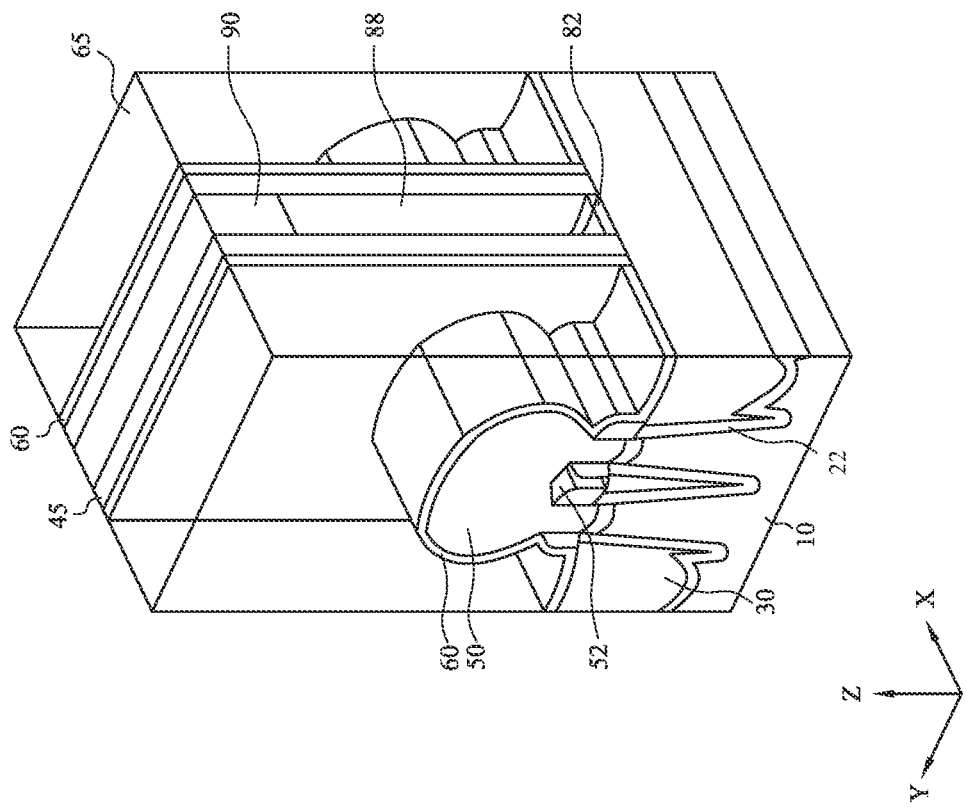
FIG. 13 shows one of the stages of a sequential process for manufacturing a semiconductor device according to an embodiment of the present disclosure.

After the sacrificial gate structures are removed, a gate dielectric layer 82 is formed around the exposed fin structures 20, and a gate electrode layer 88 is formed on the gate dielectric layer 82, as shown in FIG. 13.

In certain embodiments, the gate dielectric layer 82 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 82 includes an interfacial layer formed between the channel layers and the dielectric material.

The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness on the channel regions. The thickness of the gate dielectric layer 82 is in a range from about 1 nm to about 6 nm in some embodiments.

The gate electrode layer 88 is formed on the gate dielectric layer 82. The gate electrode 88 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 88 may be formed by CVD, ALD, electro-plating, or other suitable method. The gate electrode layer is also deposited over the upper surface of the ILD layer 65. The gate dielectric layer and the gate electrode layer formed over the ILD layer 65 are then planarized by using, for example, CMP, until the top surface of the ILD layer 65 is revealed.

After the planarization operation, the gate electrode layer 88 is recessed and a cap insulating layer 90 is formed over the recessed gate electrode 88, as shown in FIG. 13. In some embodiments, the cap insulating layer 90 includes one or more layers of a silicon nitride-based material, such as SiN. The cap insulating layer 90 can be formed by depositing an insulating material followed by a planarization operation.

In certain embodiments of the present disclosure, one or more work function adjustment layers (not shown) are interposed between the gate dielectric layer 82 and the gate electrode 88. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of WN, WCN, W, Ru, Co, TiN or TiSiN is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Figure 14:
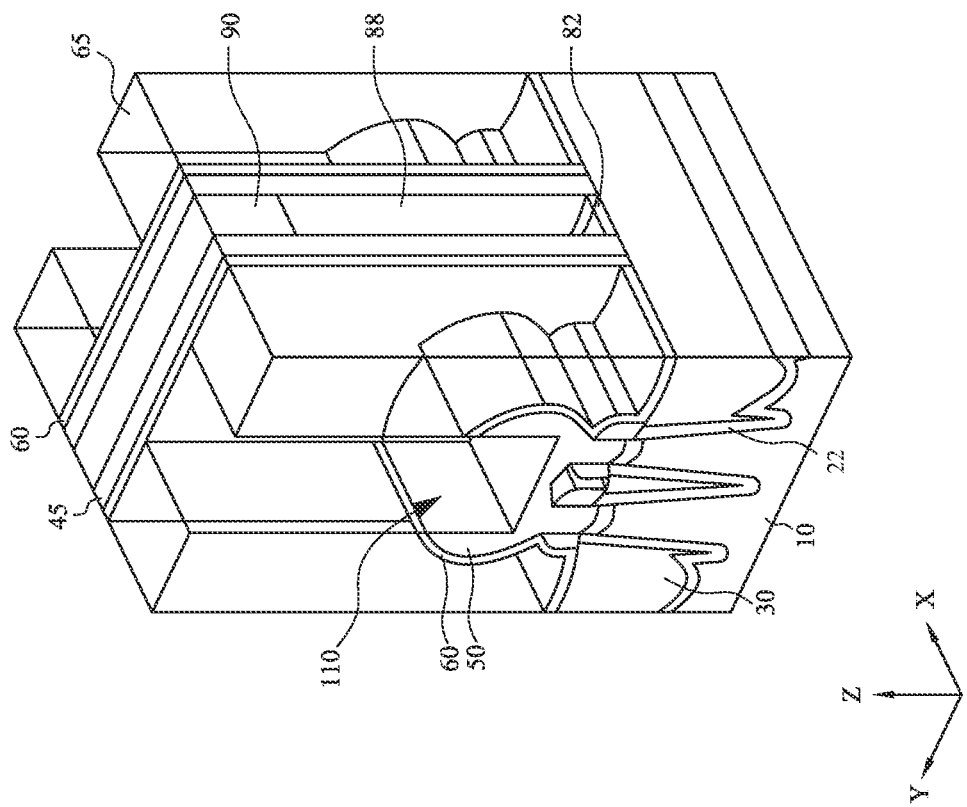
FIG. 14 shows one of the stages of a sequential process for manufacturing a semiconductor device according to an embodiment of the present disclosure.

Subsequently, contact holes 110 are formed in the ILD layer 65 by using dry etching, as shown in FIG. 14. In some embodiments, the upper portion of the S/D epitaxial layer 50 is etched.

Figure 15:
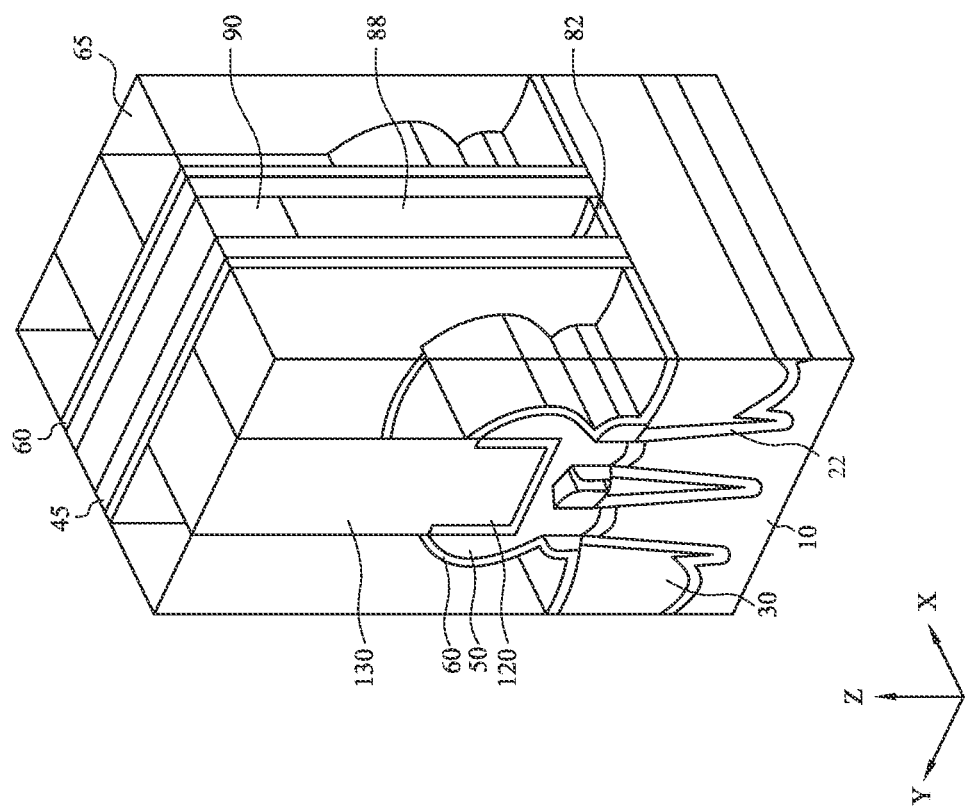
FIG. 15 shows one of the stages of a sequential process for manufacturing a semiconductor device according to an embodiment of the present disclosure.
Figure 16:
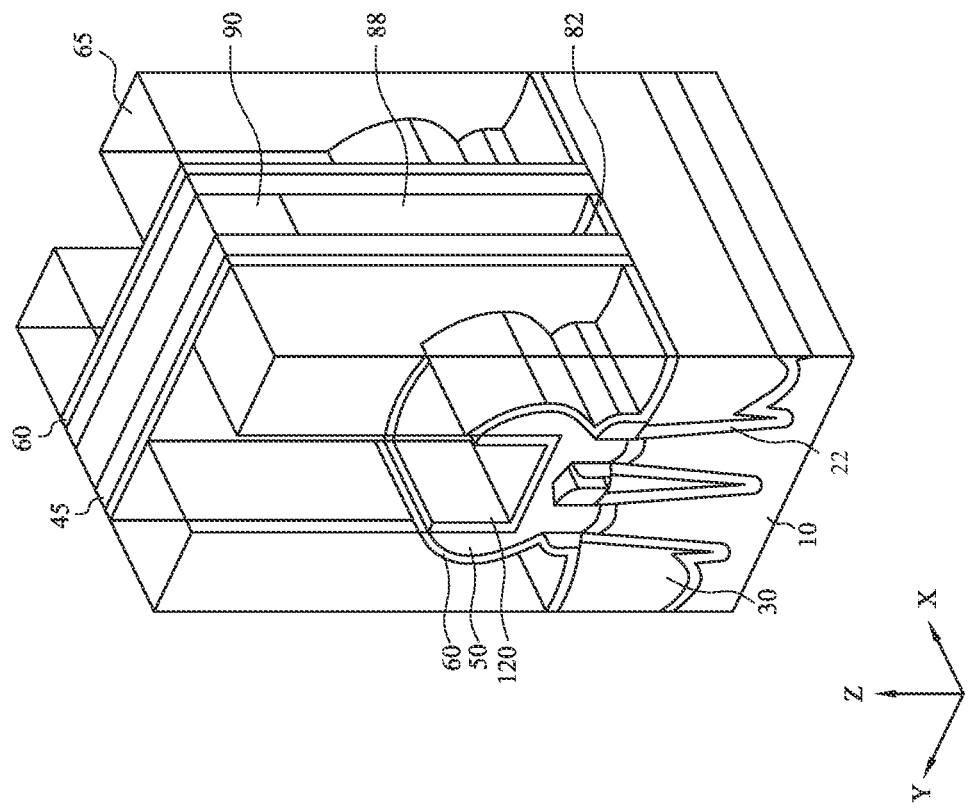
FIG. 16 shows one of the stages of a sequential process for manufacturing a semiconductor device according to an embodiment of the present disclosure.

A silicide layer 120 is formed over the S/D epitaxial layer 50, as shown in FIG. 15. The silicide layer includes one or more of WSi, CoSi, NiSi, TiSi, MoSi and TaSi. Then, a conductive material 130 is formed in the contact holes as shown in FIG. 16. The conductive material 130 includes one or more of Co, Ni, W, Ti, Ta, Cu, Al, TiN and TaN.

It is understood that the FinFETs undergo further CMOS processes to form various features such as contacts/vias, interconnect metal layers, dielectric layers, passivation layers, etc.

FIGS. 17A-19G show various views of a sequential process for a gate replacement operation according to an embodiment of the present disclosure. It is understood that additional operations can be provided before, during, and after processes shown by FIGS. 17A-19G, and some of the operations described below can be replaced or eliminated, for additional embodiments of the method. The order of the operations/processes may be interchangeable. Materials, processes, methods, dimensions and/or configuration as explained with the foregoing embodiments may be applied to the following embodiments, and detailed description thereof may be omitted.

FIGS. 17A-17D show various views after the sacrificial gate structure (sacrificial gate electrode 44 and sacrificial gate dielectric layer 42) is removed, thereby forming a gate space 49, as described with reference to FIG. 12. FIG. 17A is a cross sectional view along X1-X1 of FIG. 17D (a plan or projected view), FIG. 17B is a cross sectional view along Y1-Y1 of FIG. 17D and FIG. 17C is a cross sectional view along Y2-Y2 of FIG. 17D. In some embodiments, an insulating liner layer 60 functioning as an etching stop layer is formed before the ILD layer 65 is formed. In some embodiments, the insulating liner layer 60 includes silicon nitride. In some embodiments, an additional dielectric layer 66 is formed over the ILD layer 65. In some embodiments, the additional dielectric layer 66 includes silicon nitride.

In some embodiments, an upper portion of the gate sidewall spacer 45 is recessed as shown in FIGS. 17B and 17C. In some embodiments, the gate sidewall spacers 45 are recessed during the removal of the sacrificial gate dielectric layer, and in other embodiments, one or more dry and/or wet etching operations are performed to recess the gate sidewall spacers 45. In some embodiments, after the gate sidewall spacers 45 are recessed, the uppermost surface is made of only a silicon nitride based material (e.g., silicon nitride) (layers 60 and 66).

Figure 18B:
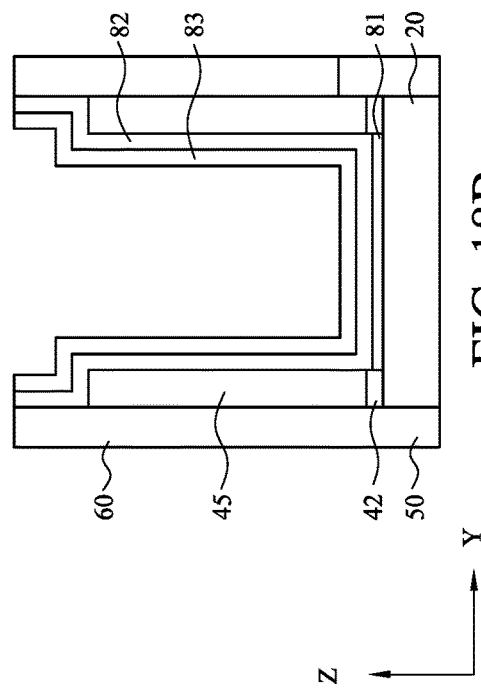
FIGS. 18A, 18B, 18C, 18D, 18E and 18F show various stages of a sequential process for manufacturing a semiconductor device according to an embodiment of the present disclosure.
Figure 18D:
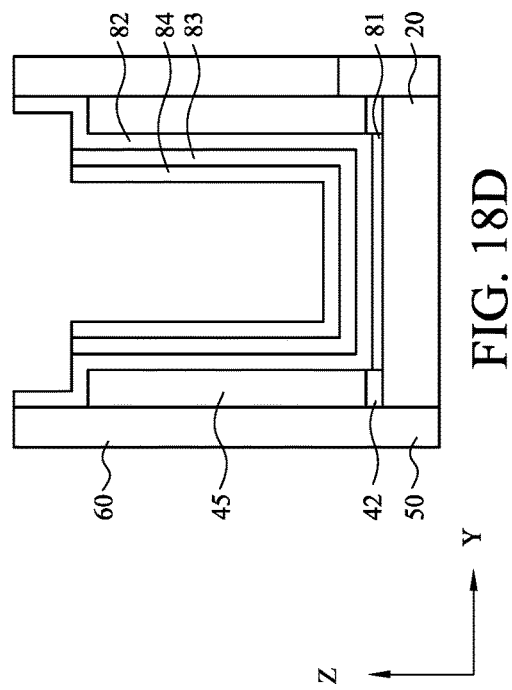
Figure 18A:
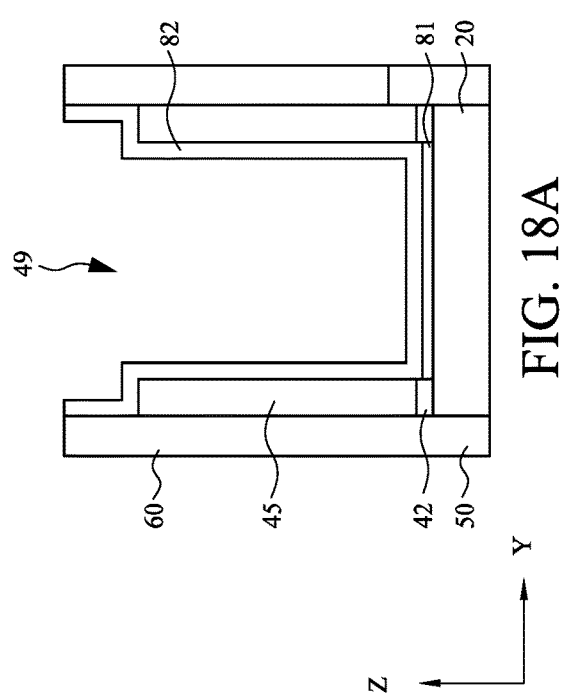

FIGS. 18A-19G are enlarged views of the gate space 49 and surrounding layers shown in FIG. 17B or 17C. As shown in FIG. 18A, an interfacial layer 81 is formed on the channel regions of the fin structures 20 and a gate dielectric layer 82 is formed over the interfacial layer and inner wall of the gate sidewall spacers 45. In some embodiments, the gate dielectric layer 82 is formed over the upper surfaces of the etching stop layer 60 and the additional dielectric layer 66. The gate dielectric layer 82 is formed by an ALD process in some embodiments to conformally form a layer over a high aspect ratio structure. In some embodiments, the aspect ratio (height/bottom diameter or area) of the gate space 49 is in a range from about 7 to about 25.

Then, as shown in FIG. 18B, a barrier layer 83 is formed over the gate dielectric layer 82. In some embodiments, the barrier layer 83 includes one or more layers of Ta, TaN, Ti, TiN or TiSiN. In some embodiments, the thickness of the barrier layer is in a range from about 1 nm to about 3 nm. In some embodiments, the barrier layer 83 is not formed. In some embodiments, the thickness of the barrier layer 83 at the bottom is thicker than the thickness at the sides. In some embodiments, the thickness of the barrier layer 83 at the bottom is about 0.5 times to three times the thickness at the sides.

Figure 18C:
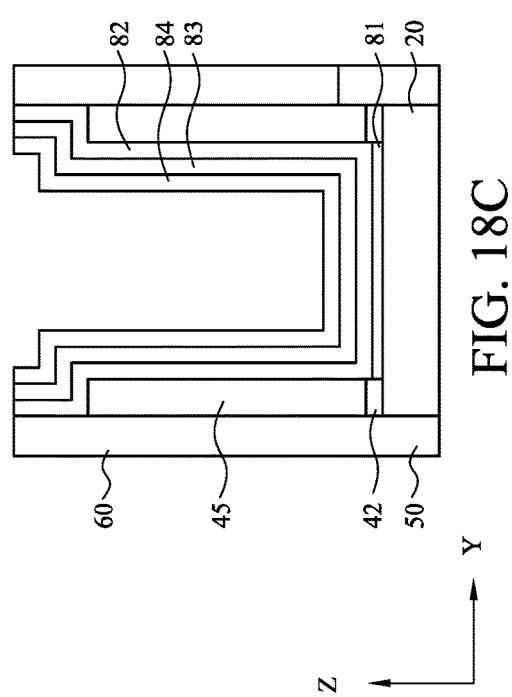

Further, as shown in FIG. 18C, one or more first work function adjustment material (WFM) layers 84 are formed over the barrier layer 83. In some embodiments, the first WFM layer 84 is a p-type WFM material, such as WN, WCN, W, Ru, Co, TiN or TiSiN. In some embodiments, the thickness of the first WFM layer is in a range from about 0.5 nm to about 10 nm and is in a range from about 1 nm to about 2 nm in other embodiments. In some embodiments, the thickness of the first WFM layer 84 at the bottom is about 0.8 times to twice the thickness at the side. When the first WFM layer is made of TiN, the TiN layer is formed from source gases including $TiCl_4$ and $NH_3$. In some embodiments, the TiN layer contains Cl as an impurity. In some embodiments, the Ti concentration in the TiN layer is in a range from about 10 atomic % to about 80 atomic %. When the Ti concentration is too small, the resistance of the TiN layer increases, and when the Ti concentration is too high, Ti diffusion may cause various problems (e.g., punch-through).

Then, as shown in FIG. 18D, an upper portion of the first WFM layer 84 is removed so that the uppermost portion of the first WFM layer 84 is below the uppermost portion of the etching stop layer 60 and the additional dielectric layer 66. In some embodiments, the uppermost portion of the first WFM layer 84 is below the uppermost portion of the gate sidewall spacers 45, and in other embodiments, the uppermost portion of the first WFM layer 84 is equal to or above the uppermost portion of the gate sidewall spacers 45 and below the uppermost portion of the etching stop layer 60 and the additional dielectric layer 66 (see, FIG. 17B).

Figure 18F:
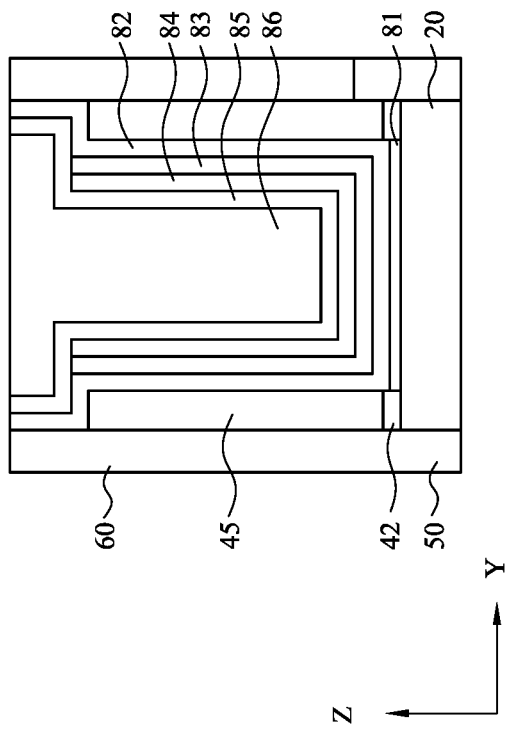
Figure 18E:
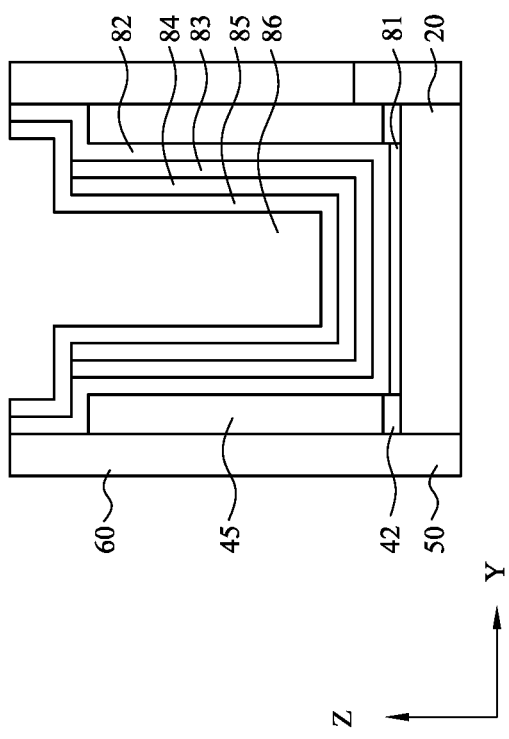

Further, as shown in FIG. 18E, one or more second WFM layers 85 are formed over the first WFM layer 84. In some embodiments, the second WFM layer 85 is an n-type WFM material, such as TiAl, TiSiAl, TiAlC, TaAl or TaAlC. In some embodiments, the thickness of the second WFM layer is in a range from about 0.5 nm to about 6 nm and is in a range from about 2 nm to about 5 nm in other embodiments. In some embodiments, the thickness of the second WFM layer 85 at the bottom is the same as or up to three times the thickness at the side.

When the second WFM layer is made of TiAlC, the TiAlC layer is formed from source gases including $TiCl_4$ and organic aluminum (e.g., triethylaluminium). In some embodiments, the TiAlC layer contains Cl as an impurity. In some embodiments, the Al concentration in the TiAlC layer is in a range from about 5 atomic % to about 80 atomic %. When the Al concentration is too small, resistance of the TiAlC layer increases, and when the Al concentration is too high, Al diffusion may cause various problems (e.g., Vt shift). In some embodiments, a p-type FET includes both the p-type WFM material and the n-type WFM material as shown in FIG. 18E, and an n-type FET does not includes the first WFM layer (p-type WFM material) 84 (see, FIG. 19F). In some embodiments, similar to the operation explained with respect to FIG. 18D, an upper portion of the second WFM layer 85 is removed.

After the WFM layers are formed, a glue layer 86 as a blocking metal layer is formed over the WFM layers using one or more deposition and CMP operations, as shown in FIG. 18F. In some embodiments, the blocking metal layer 86 includes one or more of Ta, TaN, Ti, TiN or TiSiN. In certain embodiments, TiN is used. In other embodiments, WCN is used. In some embodiments, none of the layers 83, 84, 85 and 86 include a metal W layer containing more than 90 atomic % of W. In some embodiments, the thickness of the blocking metal layer 86 is in a range from about 3 nm to about 20 nm. As shown in FIG. 18F, the blocking metal layer 86 fully fills the gate space, while the gate dielectric layer 82, the barrier layer 83 and the WFM layers 84, 85 include a U-shape cross section (having a bottom and two vertical portions) in the Y direction (source-to-drain direction). In some embodiments, since the gate sidewall spacers 45 are recessed, the CMP is performed using the etching stop layer 60 and the additional dielectric layer 66, both made of silicon nitride, as a CMP stop layer. Therefore, no silicon oxide or silicon oxide based material are polished in the CMP operation.

Figure 19A:
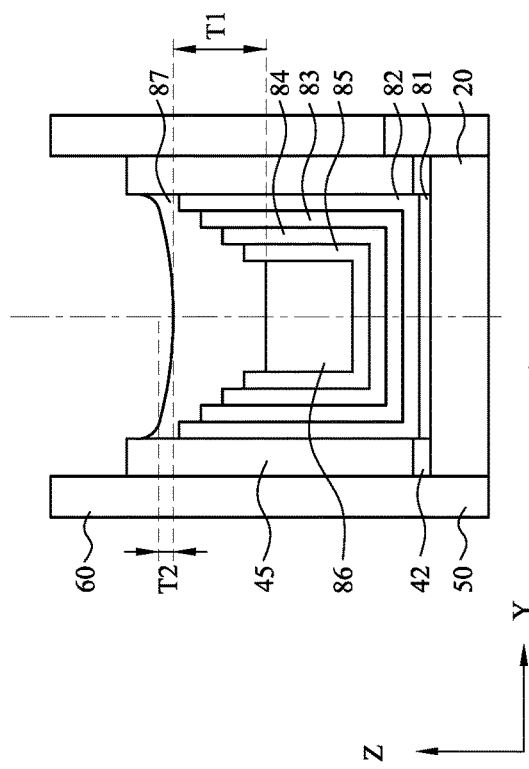
FIGS. 19A, 19B, 19C, 19D, 19E, 19F and 19G show various stages of a sequential process for manufacturing a semiconductor device according to an embodiment of the present disclosure.

Then, as shown in FIG. 19A, an upper portion of the layers formed in the gate space is recessed by one or more etching operations. In some embodiments, in the etching operations, an upper part of the sidewall spacers 45 and/or an upper portion of the gate dielectric layer 82 are also etched. As shown in FIG. 19A, the top of the blocking layer 86 is lower than the top of the first and second WFM layers 84, 85, and the tops of the WFM layers are lower than the top of the gate dielectric layer 82 in some embodiments. In other embodiments, the top of the blocking metal layer 86 is higher than the top of either or both of the WFM layers.

Figure 19B:
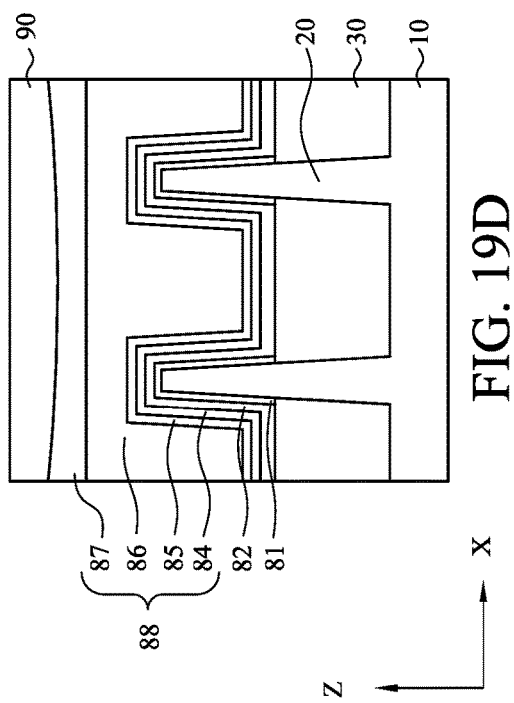

Subsequently, as shown in FIG. 19B, a contact metal layer 87 is formed over the recessed layers. In some embodiments, the contact metal layer 87 includes W, Ta, Sn, Nb, Ru, Co or Mo. In some embodiments, the contact metal layer 87 is formed by an ALD process using metal halide (chloride) gases (e.g., $TaCl_5$, $SnCl_4$, $NbCl_5$ or $MoCl_4$). In some embodiments, the contact metal layer 87 includes fluorine-free metal, for example, fluorine-free W formed by $WCl_5$ as a source gas. In some embodiments, the ALD process is a selective deposition process combined with an etching process such that the contact metal layer 87 grows from metallic under-layers, such as, the barrier layer, the WFM layers and the blocking metal layer, and no metal layer is grown from dielectric layers. Since the aspect ratio of the gate space 49 when the contact metal layer is formed is high (e.g., 3-20), the ALD process using metal halide gases effectively forms the contact metal 87 without forming voids. Further, as a metal gate pitch shrinks, the width of the gate space is not sufficient to form an extra (e.g., sacrificial) layer. By using a selective deposition directly on the WFM layer, it is possible to reduce a damage on a metal gate structure.

In some embodiments, the thickness T1 of the contact metal layer 87 is in a range from about 1 nm to about 10 nm. When the thickness of the contact metal layer 87 is too small, a later-formed gate contact made of W may not be sufficiently formed because the contact metal layer 87 can function as a seed layer for the W layer. When the thickness of the contact metal layer 87 is too large, the contact metal layer may be formed over the gate sidewall spacers 45, which may cause leakage. In some embodiments, a lowest portion of the upper surface of the contact metal layer 87 is located just above the blocking metal layer 86. In some embodiments, the top of the contact metal layer 87 is lower than the top of the gate sidewall spacers 45.

In some embodiments, the thickness T2 of the contact metal layer 87 on the gate dielectric layer 82 (e.g., at the center of the thickness of the vertical portion of the gate dielectric layer) is in a range from about 0.1 nm to about 1 nm. When the thickness is too small, damage may be caused on sidewall of the contact metal layer 87, and when the thickness of too large, a seam may be formed in the contact metal layer 87.

In some embodiments, the deposition of the contact metal layer 87 includes a cleaning operation interposed between two or more deposition processes. In some embodiments, the cleaning operation includes a hot water cleaning (e.g., 80° C. or more) and/or an oxygen treatment.

In the foregoing embodiments, the thickness of the layers formed in the gate space are measured along the Z direction (normal direction to a surface of the substrate) at a center of the gate space, unless otherwise stated.

Figure 19C:
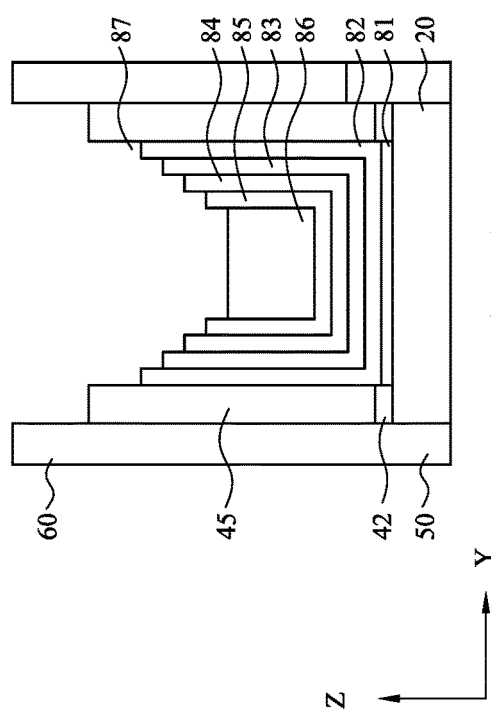
Figure 19D:
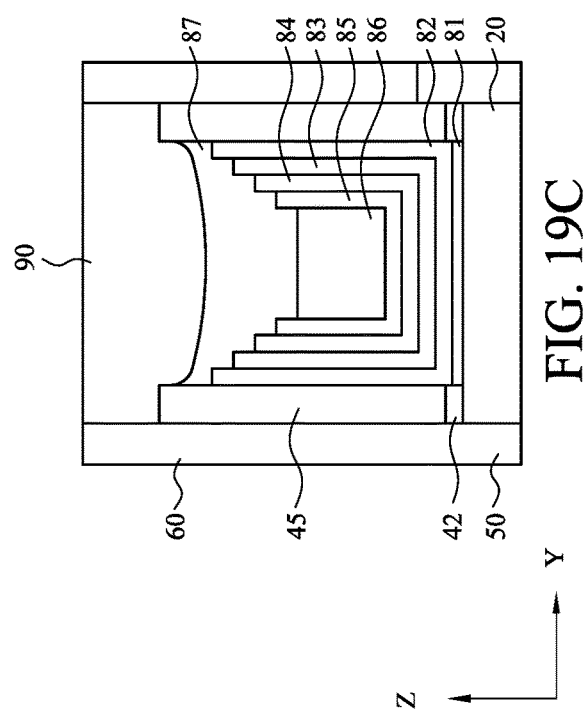
Figure 19E:
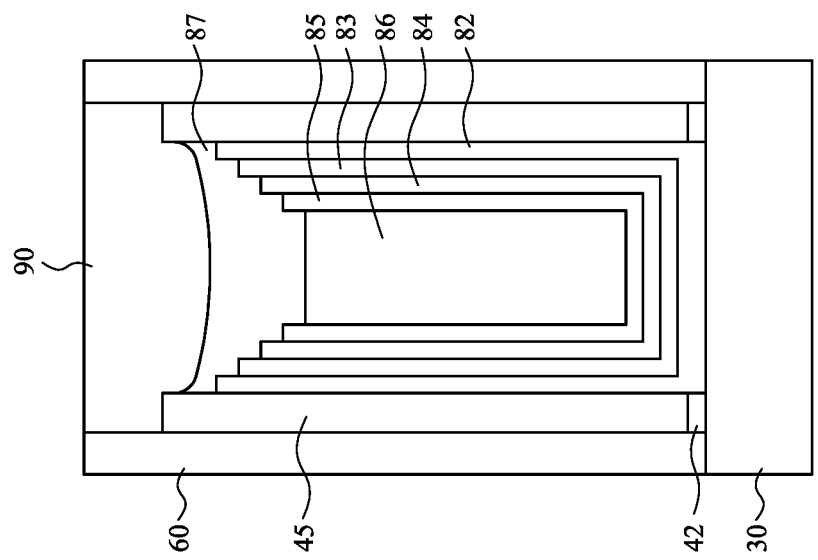

Further, as shown in FIG. 19C, a gate cap insulating layer 90 is formed over the contact metal layer 87. In some embodiments, the gate cap insulating layer 90 includes silicon nitride, SiON and/or SiOCN or any other suitable material. FIG. 19D shows a cross sectional view corresponding to X1-X1 line of FIG. 17D, and FIG. 19E shows a cross sectional view over the isolation insulating layer corresponding to Y2-Y2 line of FIG. 17D. In FIG. 19D, a barrier layer is omitted. As shown in FIG. 19D, the conductive layers 84, 85, 86 and 87 (and optionally 83) may be collectively referred to a metal gate electrode 88. As shown in FIG. 19D, the lowest point of the upper surface of the contact metal layer 87 is located between two adjacent fin structures in some embodiments.

Figure 19G:
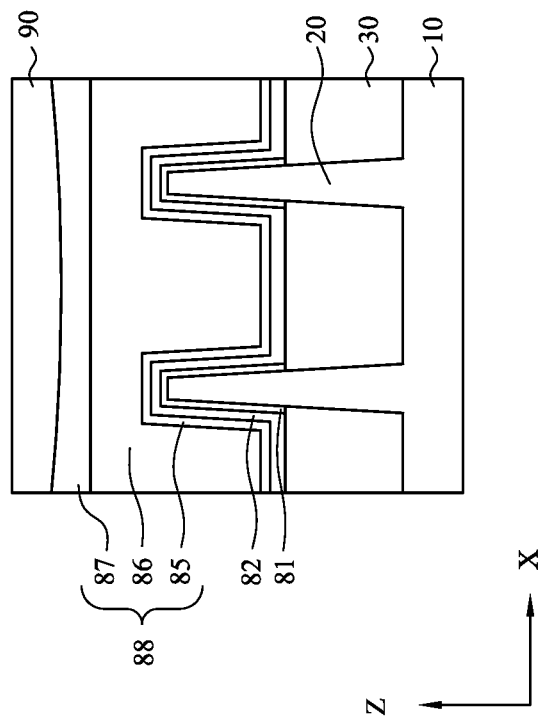
Figure 19F:
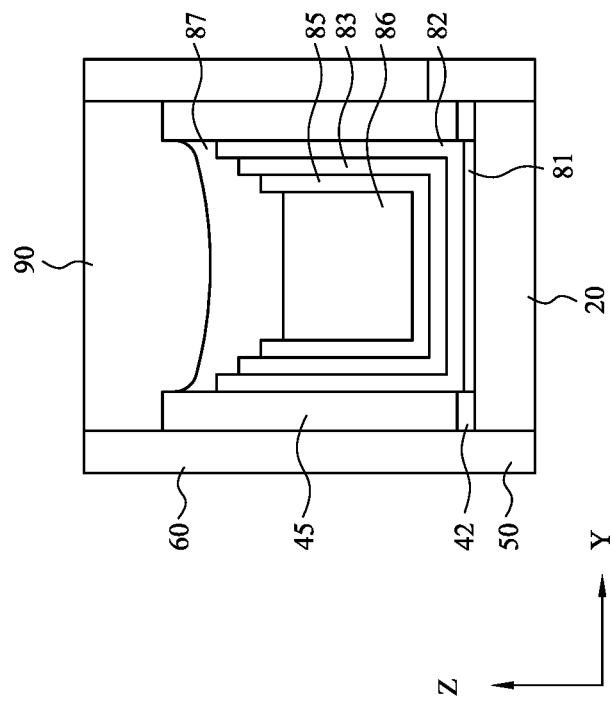

In some embodiments, in an n-type FET, the first WFM layer (p-type material layer) is not formed, as shown in FIGS. 19F and 19G. FIG. 19G shows a cross sectional view over the isolation insulating layer corresponding to X1-X1 line of FIG. 17D. In FIG. 19G, a barrier layer is omitted. As shown in FIG. 19G, the conductive layers 85, 86 and 87 (and optionally 83) may be collectively referred to a metal gate electrode 88.

Figure 20B:
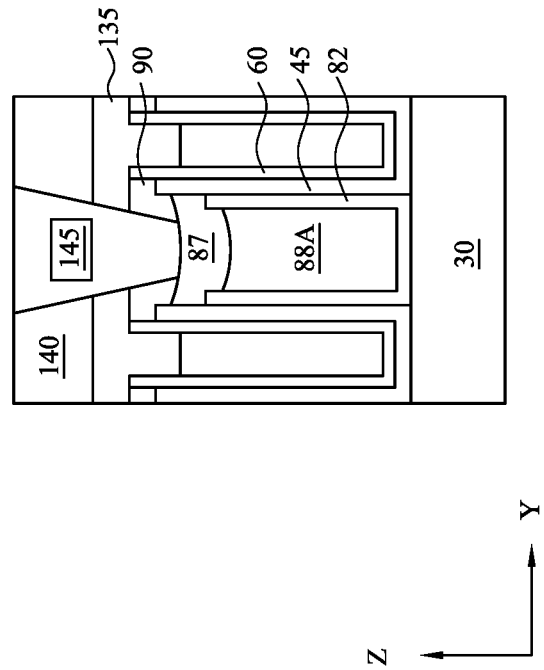
FIGS. 20A, 20B and 20C show various stages of a sequential process for manufacturing a semiconductor device according to an embodiment of the present disclosure.
Figure 20A:
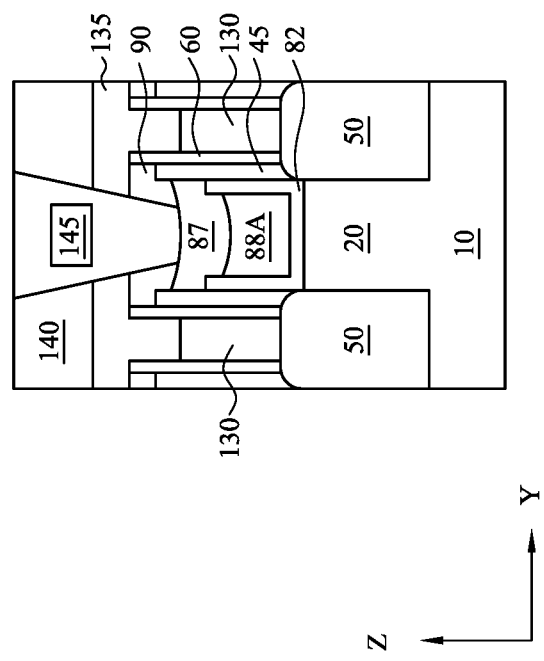
Figure 20C:
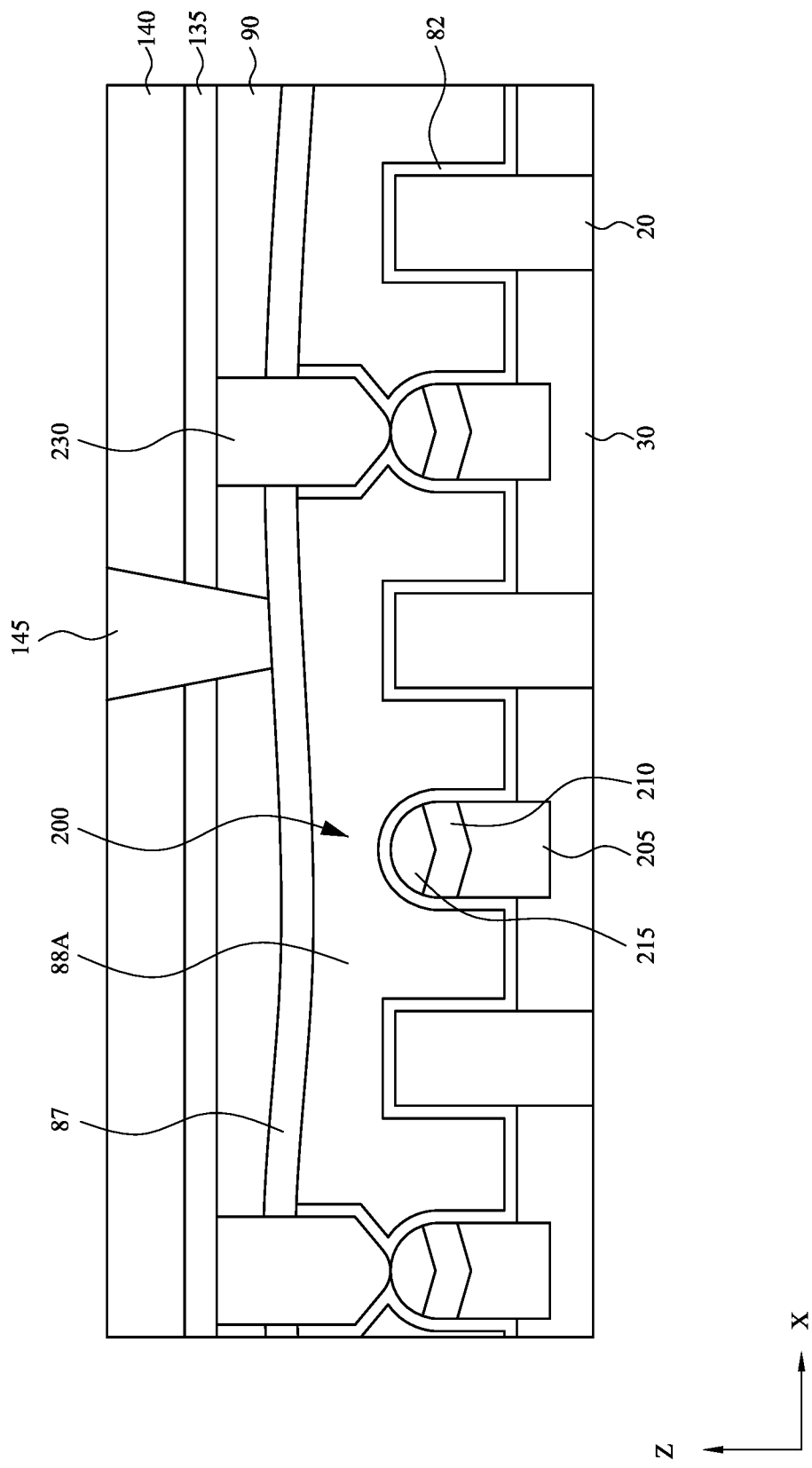

FIGS. 20A, 20B and 20C show cross sectional views after a gate contact 145 is formed. FIG. 20A shows a cross sectional view over the fin structure 20 corresponding to Y1-Y1 line of FIG. 17D, and FIG. 20B shows a cross sectional view over the isolation insulating layer corresponding to Y2-Y2 line of FIG. 17D. FIG. 20C shows a cross section along the X direction.

In some embodiments, after the gate cap insulating layer 90 is formed, a second ILD layer 135 and a third ILD layer 140 are formed, and a contact hole is formed over the contact metal layer 87 by using one or more lithography and etching operations. Then, the contact hole is filled with one or more conductive materials to form the gate contact 145. In some embodiments, the gate contact 145 includes W formed using $WF_6$ or $WF_4$ as a source gas. The gate contact 145 includes more impurities (e.g., fluorine, nitrogen and/or oxygen) than the contact metal layer 87 in some embodiments. After the deposition of W, a CMP operation is performed to remove excess W from the upper surface of the third ILD layer 140. As shown in FIGS. 20A and 20B, the edge portion in contact with the sidewall spacers 45 of the upper surface of the contact metal layer 87 is higher than the center of the upper surface of the contact metal layer 87. The highest point of the contact metal layer 87 is located between the gate sidewall spacer and a vertical portion of one of the barrier layer and WFM layers, in some embodiments. In the X-direction cross section of FIG. 20C, the conductive layers 83, 85 and 86 are collectively referred to a lower gate electrode 88A. As shown in FIG. 20C, the lower gate electrode 88A, which does not include W, has a wall shape (not a U-shape) and the contact metal layer 87 made of W is formed on the lower gate electrode 88A.

As shown in FIG. 20C, one or more dummy fin structures 200 are formed between active fin structures 20 used in a functional circuit in some embodiments. In some embodiments, the dummy fin structure 200 includes a lower layer 205, a middle layer 210 and an upper layer 215, all of which are made of one or more dielectric materials. In some embodiments, the lower layer 205 and the upper layer 215 include one or more of silicon oxide, silicon nitride, SiON, SiOC, SiOCN or any other suitable material. In some embodiments, the middle layer 210 is made of a different material than the lower and upper layers and includes a high-k dielectric material, such as hafnium oxide, aluminum oxide or any other suitable material.

Further, in some embodiments, a separation plug or wall 230 that physically and electrically separate one metal gate electrode from adjacent one is provided as shown in FIG. 20C. In some embodiments, the separation plug 230 is formed by patterning a sacrificial gate electrode to form an opening and filling the opening with an insulating material. In some embodiments, the separation plug 230 is formed in contact with the top of the dummy fin structure 200. In other embodiments, the separation plug 230 is in contact with the isolation insulating layer 30. In some embodiments, the gate contact 145 is located above the fin structure 20, and in other embodiments, the gate contact 145 is located above the dummy fin structure 200.

Figure 21:
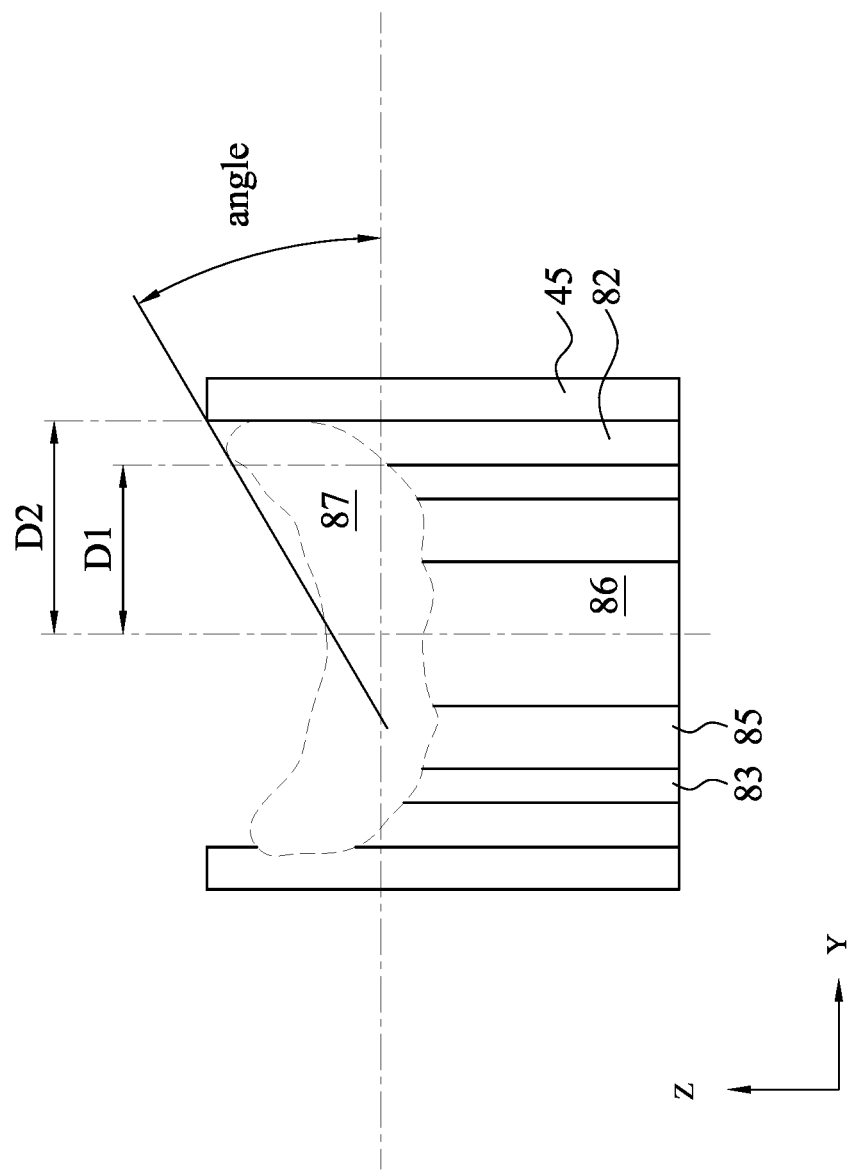
FIG. 21 shows one of the stages of a sequential process for manufacturing a FET device according to an embodiment of the present disclosure.

As shown in FIG. 21, an angle formed by the horizontal line and the line connecting the lowest portion of the upper surface of the contact metal layer 87 (or the cross point of the center line of the gate space and the upper surface of the contact metal layer) and the highest portion of the upper surface of the contact metal layer 87 is in a range from about 30 degrees to about 60 degrees in some embodiments. When the angle is too small, damage may be caused to the sidewall of the contact metal layer 87, and it may be difficult to make the angle over 60 degrees by known deposition technologies.

When the distance between the center line of the gate space to the inner sidewall of the gate sidewall spacer 45 is D2, the highest portion of the contact metal layer 87 is located at the distance D1 from the center of the gate space, where $0.7 \leq D1/D2 \leq 1.0$ in some embodiments. In other embodiments, $0.8 \leq D1/D2 \leq 0.95$. When the highest portion is located within these ranges, the contact metal layer effectively protects the second WFM layer containing Al from subsequent CMP operations for forming the gate contact.

FIGS. 22A-22G show various views of a sequential process for a gate replacement operation according to an embodiment of the present disclosure. It is understood that additional operations can be provided before, during, and after processes shown by FIGS. 22A-22G, and some of the operations described below can be replaced or eliminated, for additional embodiments of the method. The order of the operations/processes may be interchangeable. Materials, processes, methods, dimensions and/or configurations as explained with the foregoing embodiments may be applied to the following embodiments, and detailed description thereof may be omitted.

In FIGS. 22A-22G, metal gate structures for narrow channel FETs having a gate length equal to or less than about 14 nm (and more than, for example, about 5 nm) and a long channel FET having a gate length equal to or more than 20 nm (and less than, for example, about 1 μm) are manufactured. In FIGS. 22A-22G, two p-type narrow channel FETs PMOS1 and PMOS2 having different threshold voltages (and having different WFM materials), a n-type narrow channel FET NMOS1 and a n-type long channel FET NMOS2 are shown. However, a semiconductor device may include two or more n-type narrow channel FETs, three or more p-type narrow channel FETs, one or more p-type long channel FETs and/or two or more n-type long channel FETs.

Figure 22A:
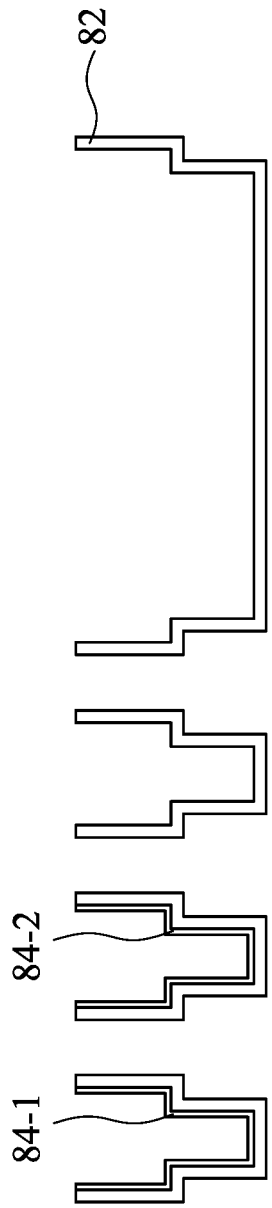
FIGS. 22A, 22B, 22C, 22D, 22E, 22F and 22G show various stages of a sequential process for manufacturing a semiconductor device according to an embodiment of the present disclosure.

As shown in FIG. 22A, similar to FIG. 18C, a first p-type WFM layer 84-1 and a second p-type WFM layer 84-2 are formed over a gate dielectric layer 82 for the first p-type FET PMOS1 and the second p-type FET PMOS2, respectively. No p-type WFM layer is formed for n-type FETs NMOS1 and NMOS2. In some embodiments, a barrier layer is formed before forming the WFM layers similar to FIG. 18B. In some embodiments, the first p-type WFM layer 84-1 and the second p-type WFM layer 84-2 are made of different materials and/or different thicknesses. In some embodiments, the first p-type WFM layer 84-1 includes a Ti-based material (TiN, TiSiN, etc.) and the second p-type WFM layer 84-2 includes a W-based material (WN, WCN, W, etc.).

Figure 22B:
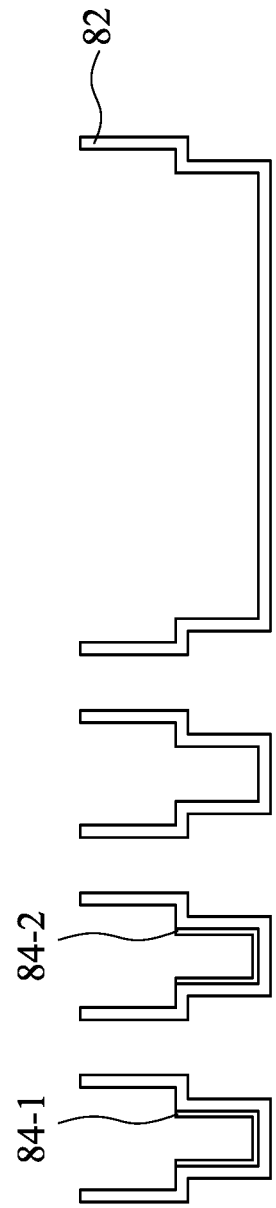

Then, similar to FIG. 18D, upper portions of the p-type WFM layers 84-1 and 84-2 are removed so that the uppermost portions of the p-type WFM layers are below the uppermost portion of the etching stop layer and the additional dielectric layer, as shown in FIG. 22B.

Figure 22C:
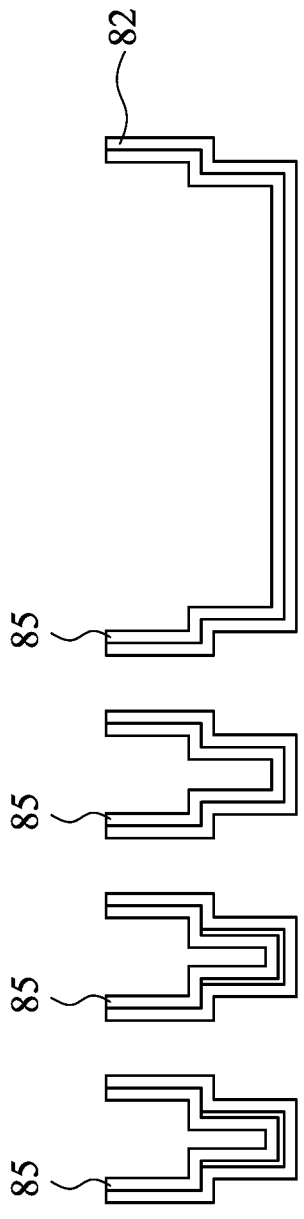
Figure 22D:
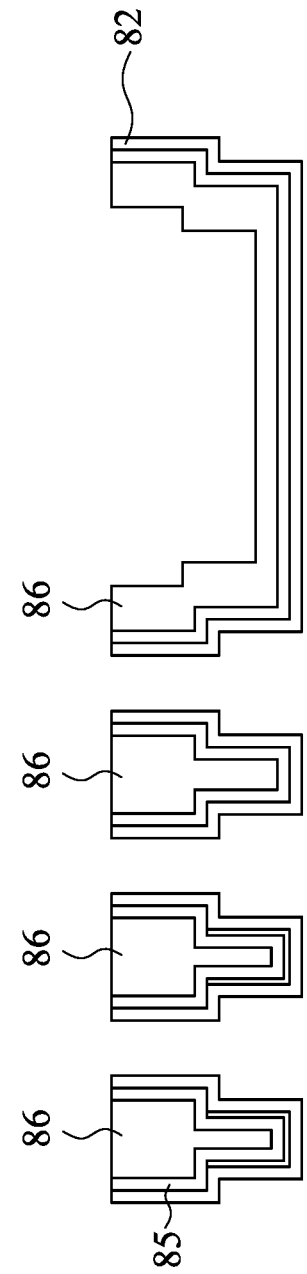

Further, similar to FIG. 18E, an n-type WFM layer 85 is formed for the p-type FETs PMOS1, PMOS2 and the n-type FETs NOMS1, NMOS2, as shown in FIG. 22C. Next, similar to FIG. 18F, a glue layer 86 as a blocking metal layer is formed over the WFM layers using one or more deposition and CMP operations, as shown in FIG. 22D. In some embodiments, the blocking metal layer 86 fully fills the gate spaces of the narrow channel FETs PMOS1, PMOS2 and NMOS1, while the blocking layer 86 is conformally formed in the gate space of the long channel FET NMOS2 showing a U-shape cross section.

Figure 22E:
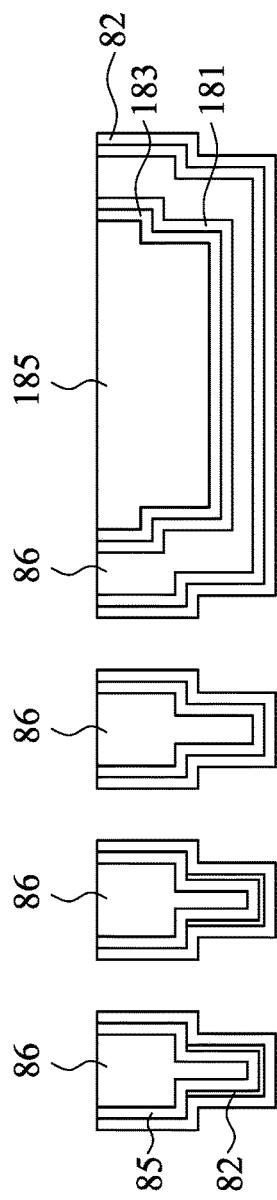

Then, as shown in FIG. 22E, one or more conductive layers are formed on the blocking metal layer (glue layer) 86 in the long channel n-type FET NMOS2. In some embodiments, the conductive layer includes a W layer 181 formed by an ALD process and a W layer 183 formed by a CVD process. Further, a cap insulating layer 185 is formed over the conductive layers. The conductive layers and/or the cap insulating layer 185 are formed by one or more deposition and CMP operations. In some embodiments, the cap insulating layer 185 includes silicon nitride.

Figure 22F:
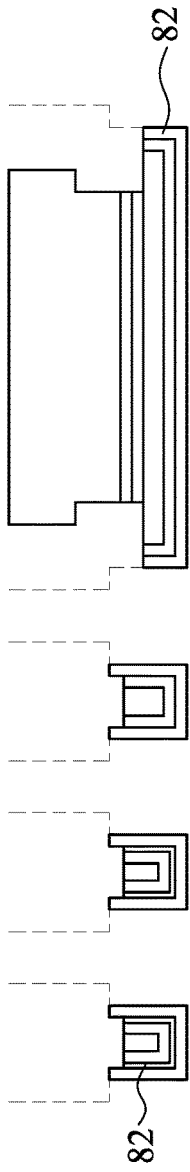

Subsequently, similar to FIG. 19A, an upper portion of the layers formed in the gate spaces is recessed by one or more etching operations, as shown in FIG. 22F. In some embodiments, in the etching operations, the cap insulating layer 185 is not etched and thus protects the W layers 181, 183 at the bottom of the cap insulating layer 185.

Figure 22G:
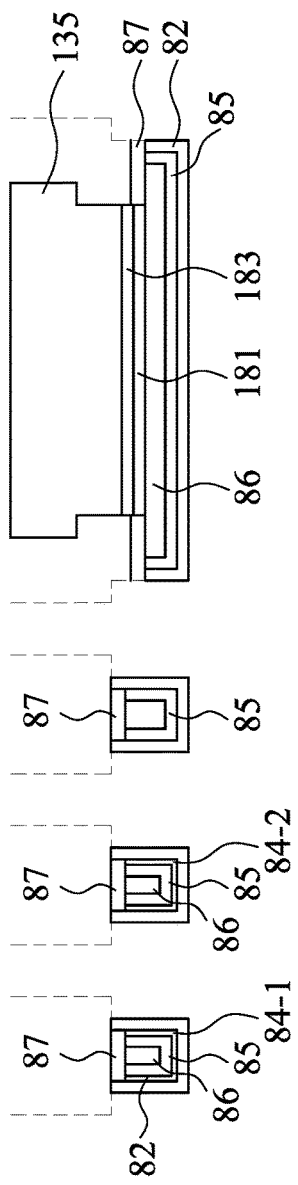

Then, similar to FIG. 19B, a contact metal layer 87 is formed over the recessed structure, as shown in FIG. 22G. Subsequently, a gate cap insulating layer 90 is formed. After the structures shown in FIG. 22G are formed, one or more dielectric layers (e.g., ILDs) are formed over the contact metal layers 87.

The various embodiments or examples described herein offer several advantages over the existing art. In the embodiments of the present disclosure, since the gate space is fully filled by a blocking metal layer (glue layer), no seam is formed in a W layer in the metal gate electrode. Further, the W layer formed over the recessed WFM layers can protect the WFM layers from chemicals used in subsequently performed CMP operations.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a gate space is formed by removing a sacrificial gate electrode, a gate dielectric layer is formed in the gate space, conductive layers are formed on the gate dielectric layer to fully fill the gate space, the gate dielectric layer and the conducive layers are recessed to form a recessed gate electrode, and a contact metal layer is formed on the recessed gate electrode. The recessed gate electrode does not include a tungsten layer, and the contact metal layer includes tungsten. In one or more of the foregoing and following embodiments, at least one of the conductive layers has a U-shape cross section, and at least one of the conductive layers does not have a U-shape cross section. In one or more of the foregoing and following embodiments, the at least one of the conductive layers that does not have a U-shape cross section includes TiN or WCN. In one or more of the foregoing and following embodiments, the contact metal layer covers a top of the gate dielectric layer. In one or more of the foregoing and following embodiments, an upper surface of the contact metal layer has a convex shape toward the recessed gate electrode. In one or more of the foregoing and following embodiments, the convex shape has a slope having an angle of 30 degrees to 60 degrees. In one or more of the foregoing and following embodiments, the contact metal layer is formed by an atomic layer deposition using a fluorine-free W source gas.

In accordance with another aspect of the present disclosure, in a method of manufacturing a semiconductor device, a fin structure protruding from an isolation insulating layer disposed over a substrate is formed, a sacrificial gate dielectric layer is formed over the fin structure, a sacrificial gate electrode layer is formed over the sacrificial gate dielectric layer, gate sidewall spacers are formed, one or more dielectric layers are formed, a gate space is formed by removing the sacrificial gate electrode layer and the sacrificial gate dielectric layer, after the gate space is formed, the gate sidewall spacers are recessed, a gate dielectric layer is formed in the gate space, conductive layers are formed on the gate dielectric layer to fully fill the gate space, the gate dielectric layer and the conducive layers are recessed to form a recessed gate electrode; and a contact metal layer is formed on the recessed gate electrode. In one or more of the foregoing and following embodiments, the one or more dielectric layer includes an etching stop layer conformally formed on side faces of the gate sidewall spacers and an interlayer dielectric (ILD) layer formed on the etching stop layer. In one or more of the foregoing and following embodiments, the ILD layer includes a silicon oxide layer and a silicon nitride layer, both of which are in contact with the etching stop layer. In one or more of the foregoing and following embodiments, the etching stop layer includes silicon nitride. In one or more of the foregoing and following embodiments, the gate dielectric layer is formed on a top of the recessed gate sidewall spacers and in contact with the etching stop layer. In one or more of the foregoing and following embodiments, the contact metal layer is one of W, Ta, Sn, Nb or Mo formed by a deposition method using a metal chloride gas. In one or more of the foregoing and following embodiments, a gate cap insulating layer is formed over the contact metal layer, one or more dielectric layers are formed over the gate cap insulating layer, and a gate contact is formed in contact with the contact metal layer. In one or more of the foregoing and following embodiments, the contact metal layer includes a lower amount of fluorine than the gate contact.

In accordance with another aspect of the present disclosure, a semiconductor device includes a fin structure protruding from an isolation insulating layer disposed over a substrate and having a channel region, a source/drain epitaxial layer, a gate dielectric layer disposed on the channel region, and a gate electrode layer disposed on the gate dielectric layer. The gate electrode includes a lower portion and an upper portion, and the lower portion includes conductive layers, at least one of the conductive layers has a U-shape cross section, and at least one of the conductive layers does not have a U-shape cross section. In one or more of the foregoing and following embodiments, the upper portion is made of tungsten. In one or more of the foregoing and following embodiments, the gate dielectric layer has a U-shape in a cross section, and the upper portion covers a top of a vertical portion of the U-shape of the gate dielectric layer. In one or more of the foregoing and following embodiments, an upper surface of the upper portion has a convex shape toward the lower portion, and the convex shape has a slope having an angle of 30 degrees to 60 degrees. In one or more of the foregoing and following embodiments, the semiconductor device further includes a gate contact in contact with the upper portion and having a higher fluorine concentration than the upper portion.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   forming a fin structure protruding from an isolation insulating layer disposed over a substrate;
   forming a sacrificial gate dielectric layer over the fin structure;
   forming a sacrificial gate electrode layer over the sacrificial gate dielectric layer;
   forming gate sidewall spacers;
   forming one or more dielectric layers;
   forming a gate space by removing the sacrificial gate electrode layer and the sacrificial gate dielectric layer;
   after the gate space is formed, reducing a height of the gate sidewall spacers by recessing the gate sidewall spacers such that an upper part of a side face of one of the one or more dielectric layers contacting the gate sidewall spacers is exposed;
   after the gate sidewall spacers are recessed, forming a gate dielectric layer in the gate space;
   forming conductive layers on the gate dielectric layer to fully fill the gate space;
   recessing the gate dielectric layer and the conductive layers to form a recessed gate electrode; and
   forming a contact metal layer on the recessed gate electrode.

2. The method of claim 1, wherein the one or more dielectric layer includes an etching stop layer conformally formed on side faces of the gate sidewall spacers and an interlayer dielectric (ILD) layer formed on the etching stop layer.

3. The method of claim 2, wherein the ILD layer includes a silicon oxide layer and a silicon nitride layer, both of which are in contact with the etching stop layer.

4. The method of claim 3, wherein the etching stop layer includes silicon nitride.

5. The method of claim 2, wherein the gate dielectric layer is formed on a top of the recessed gate sidewall spacers and in contact with the etching stop layer.

6. The method of claim 2, wherein the contact metal layer is one of W, Ta, Sn, Nb or Mo formed by a deposition method using a metal chloride gas.

7. The method of claim 2, further comprising:
   forming a gate cap insulating layer over the contact metal layer;
   forming one or more dielectric layers over the gate cap insulating layer; and
   forming a gate contact in contact with the contact metal layer.

8. The method of claim 7, wherein the contact metal layer includes a lower amount of fluorine than the gate contact.

9. A method of manufacturing a semiconductor device, comprising:
   forming a fin structure;
   forming a sacrificial gate dielectric layer over the fin structure;
   forming a sacrificial gate electrode layer over the sacrificial gate dielectric layer;
   forming gate sidewall spacers;
   forming one or more dielectric layers;
   forming a gate space by removing the sacrificial gate electrode layer and the sacrificial gate dielectric layer;
   after the gate space is formed, reducing a height of the gate sidewall spacers by recessing the gate sidewall spacers such that an upper part of a side face of one of the one or more dielectric layers contacting the gate sidewall spacers is exposed;
   after the gate sidewall spacers are recessed, forming a gate dielectric layer in the gate space;
   forming conductive layers on the gate dielectric layer to fully fill the gate space;
   recessing the gate dielectric layer and the conductive layers to form a recessed gate electrode; and
   forming a contact metal layer on the recessed gate electrode,
   wherein the recessed gate electrode does not include a tungsten layer, and
   the contact metal layer includes tungsten.

10. The method of claim 9, wherein:
    at least one of the conductive layers has a U-shape cross section, and
    at least one of the conductive layers does not have a U-shape cross section.

11. The method of claim 9, wherein the at least one of the conductive layers that does not have a U-shape cross section includes TiN or WCN.

12. The method of claim 9, wherein the contact metal layer covers a top of the gate dielectric layer.

13. The method of claim 9, wherein an upper surface of the contact metal layer has a convex shape toward the recessed gate electrode.

14. The method of claim 9, wherein the convex shape has a slope having an angle of 30 degrees to 60 degrees.

15. The method of claim 9, wherein the contact metal layer is formed by an atomic layer deposition using a fluorine-free W source gas.

16. A method of manufacturing a semiconductor device, comprising:
   forming fin structures;
   forming a sacrificial gate dielectric layer over the fin structures;
   forming a sacrificial gate electrode layer over the sacrificial gate dielectric layer;
   forming gate sidewall spacers;
   forming one or more dielectric layers;
   forming a gate space by removing the sacrificial gate electrode layer and the sacrificial gate dielectric layer;
   after the gate space is formed, reducing a height of the gate sidewall spacers by recessing the gate sidewall spacers such that an upper part of a side face of one of the one or more dielectric layers contacting the gate sidewall spacers is exposed;
   after the gate sidewall spacers are recessed, forming a gate dielectric layer in the gate space;
   forming conductive layers on the gate dielectric layer to fully fill the gate space;
   recessing the gate dielectric layer and the conductive layers to form a recessed gate electrode; and
   forming a contact metal layer on the recessed gate electrode, wherein the recessed gate electrode does not include a tungsten layer, and the contact metal layer includes tungsten.

17. The method of claim 16, wherein:

at least one of the conductive layers has a U-shape cross section, and at least one of the conductive layers does not have a U-shape cross section.

18. The method of claim 16, wherein the at least one of the conductive layers that does not have a U-shape cross section includes TiN or WCN.

19. The method of claim 16, wherein the contact metal layer covers a top of the gate dielectric layer.

20. The method of claim 16, wherein an upper surface of the contact metal layer has a convex shape toward the recessed gate electrode.

\* \* \* \* \*